US012660211B2

(12) United States Patent (10) Patent No.: US 12,660,211 B2

Lin et al. (45) Date of Patent: Jun. 16, 2026

(54) HIGH DENSITY CAPACITOR AND METHODS OF FORMING THE SAME

(71) Applicant: Taiwan Semiconductor Manufacturing Company Limited, Hsinchu (TW)

(72) Inventors: Meng-Hsien Lin, Tainan City (TW); Dun-Nian Yaung, Taipei City (TW); Jen-Cheng Liu, Hsinchu City (TW); Hsing-Chih Lin, Tainan City (TW); Ko Chun Liu, Toufen Town (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 376 days.

(21) Appl. No.: 18/352,532

(22) Filed: Jul. 14, 2023

(65) Prior Publication Data

US 2025/0022912 A1 Jan. 16, 2025

(51) Int. Cl.
| *H10D 1/00* | (2025.01) |
| *H10B 53/10* | (2023.01) |

(Continued)

(52) U.S. Cl.
CPC ............. *H10D 1/042* (2025.01); *H10B 53/10* (2023.02); *H10B 53/30* (2023.02); *H10D 1/043* (2025.01); *H10D 1/716* (2025.01)

(58) Field of Classification Search
CPC ........ H10D 1/042; H10D 1/716; H10D 1/043; H10B 53/30; H10B 53/10
See application file for complete search history.

(56) References Cited

U.S. PATENT DOCUMENTS

2005/0266652 A1* 12/2005 Chudzik ............. H01L 23/5223
                                                         438/387
2011/0001217 A1* 1/2011 Neuilly .................. H10D 1/043
                                                         257/532

(Continued)

FOREIGN PATENT DOCUMENTS

CN        113851477 A      12/2021
TW        201106397 A       2/2011

(Continued)

OTHER PUBLICATIONS

Jianq Chyun Intellectual Property Office; Tw Application No. 112134134; Office Action of May 20, 2024, 8 pages.

*Primary Examiner* — Richard A Booth
(74) *Attorney, Agent, or Firm* — The Marbury Law Group, PLLC

(57) ABSTRACT

An embodiment high-density capacitor includes a bottom electrode having a plurality of non-concentric cylindrical portions, a top electrode including a plurality of vertical portions and a surrounding portion, and a dielectric layer separating the top electrode from the bottom electrode. Each of the plurality of non-concentric cylindrical portions includes an inner shell and an outer shell and each of the plurality of vertical portions is vertically surrounded by the inner shell of a respective cylindrical portion of the bottom electrode. The surrounding portion of the top electrode respectively vertically surrounds each of the plurality of non-concentric cylindrical portions of the bottom electrode such that adjacent non-concentric cylindrical portions of the bottom electrode are separated from one another by the surrounding portion of the top electrode. At least some of the plurality of non-concentric cylindrical portions of the bottom electrode include a spatial distribution having a hexagonal symmetry.

20 Claims, 24 Drawing Sheets

(51) Int. Cl.
    *H10B 53/30*        (2023.01)
    *H10D 1/68*        (2025.01)

(56)            References Cited

U.S. PATENT DOCUMENTS

| | | | |
|---|---|---|---|
| 2011/0244302 A1* | 10/2011 | Wasson | H01G 4/005 |
| | | | 216/6 |
| 2012/0019980 A1* | 1/2012 | Cho | H10B 12/033 |
| | | | 361/311 |
| 2015/0076658 A1 | 3/2015 | Kim et al. | |
| 2022/0302122 A1 | 9/2022 | Sheng et al. | |
| 2023/0011756 A1* | 1/2023 | Wu | H10D 88/00 |
| 2023/0085846 A1 | 3/2023 | Li | |
| 2023/0209807 A1 | 6/2023 | Wu et al. | |

FOREIGN PATENT DOCUMENTS

| | | | |
|---|---|---|---|
| TW | 202135286 A | 9/2021 | |
| TW | 202306130 A | 2/2023 | |

* cited by examiner

1100

1100

216

1102

204b

216

216

1102

1102

204b

1102

204b

204b

216

702

216
306
304c
302c
304b
302b
304a
302a

220

218a x z x y

B

B'

A

A'

1400

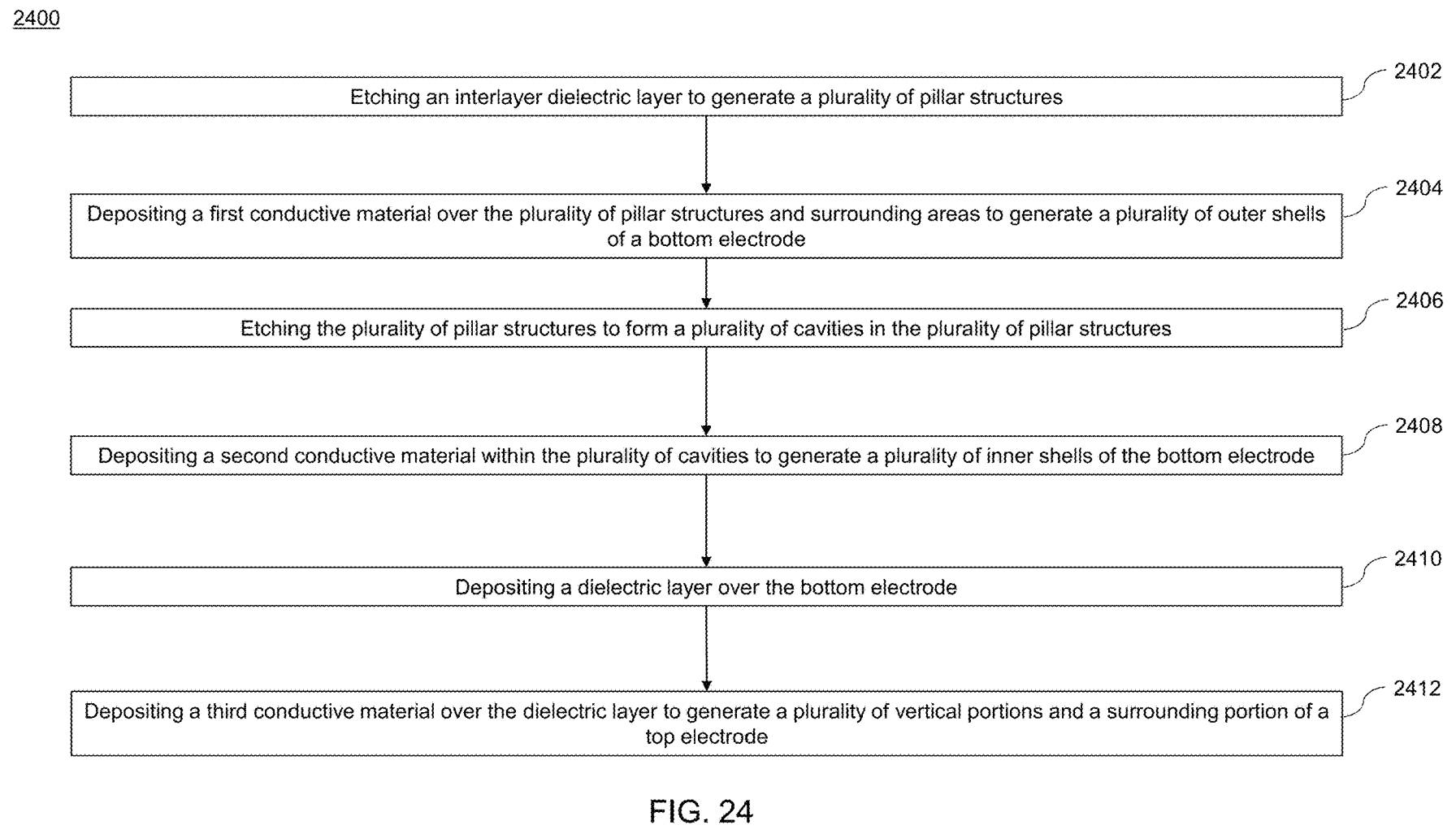

2400

2402 — Etching an interlayer dielectric layer to generate a plurality of pillar structures 2404 — Depositing a first conductive material over the plurality of pillar structures and surrounding areas to generate a plurality of outer shells of a bottom electrode 2406 — Etching the plurality of pillar structures to form a plurality of cavities in the plurality of pillar structures 2408 — Depositing a second conductive material within the plurality of cavities to generate a plurality of inner shells of the bottom electrode 2410 — Depositing a dielectric layer over the bottom electrode 2412 — Depositing a third conductive material over the dielectric layer to generate a plurality of vertical portions and a surrounding portion of a top electrode

FIG. 24

HIGH DENSITY CAPACITOR AND METHODS OF FORMING THE SAME

BACKGROUND

The semiconductor industry has grown due to continuous improvements in integration density of various electronic components (e.g., transistors, diodes, resistors, inductors, capacitors, etc.). For the most part, these improvements in integration density have come from successive reductions in minimum feature size, which allow more components to be integrated into a given area. In this regard, individual transistors, interconnects, and related structures have become increasingly smaller and there is an ongoing need to develop new materials, processes, and designs of semiconductor devices and interconnects to allow further progress.

Transistors made of oxide semiconductors are an attractive option for back-end-of-line (BEOL) integration since such transistors may be processed at low temperatures and thus, the fabrication of such device may not damage previously fabricated devices. For example, the fabrication conditions and techniques for such transistors using oxide semiconductors may not damage previously fabricated front-end-of-line (FEOL) and middle end-of-line (MEOL) devices. Circuits based on oxide semiconductor-based transistor devices may further include other components that may be fabricated in a BEOL process, such as capacitors, inductors, resistors, and integrated passive devices.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 24 is a flowchart illustrating operations of a method of forming a high-density capacitor, according to various embodiments.

DETAILED DESCRIPTION

Figure 1:
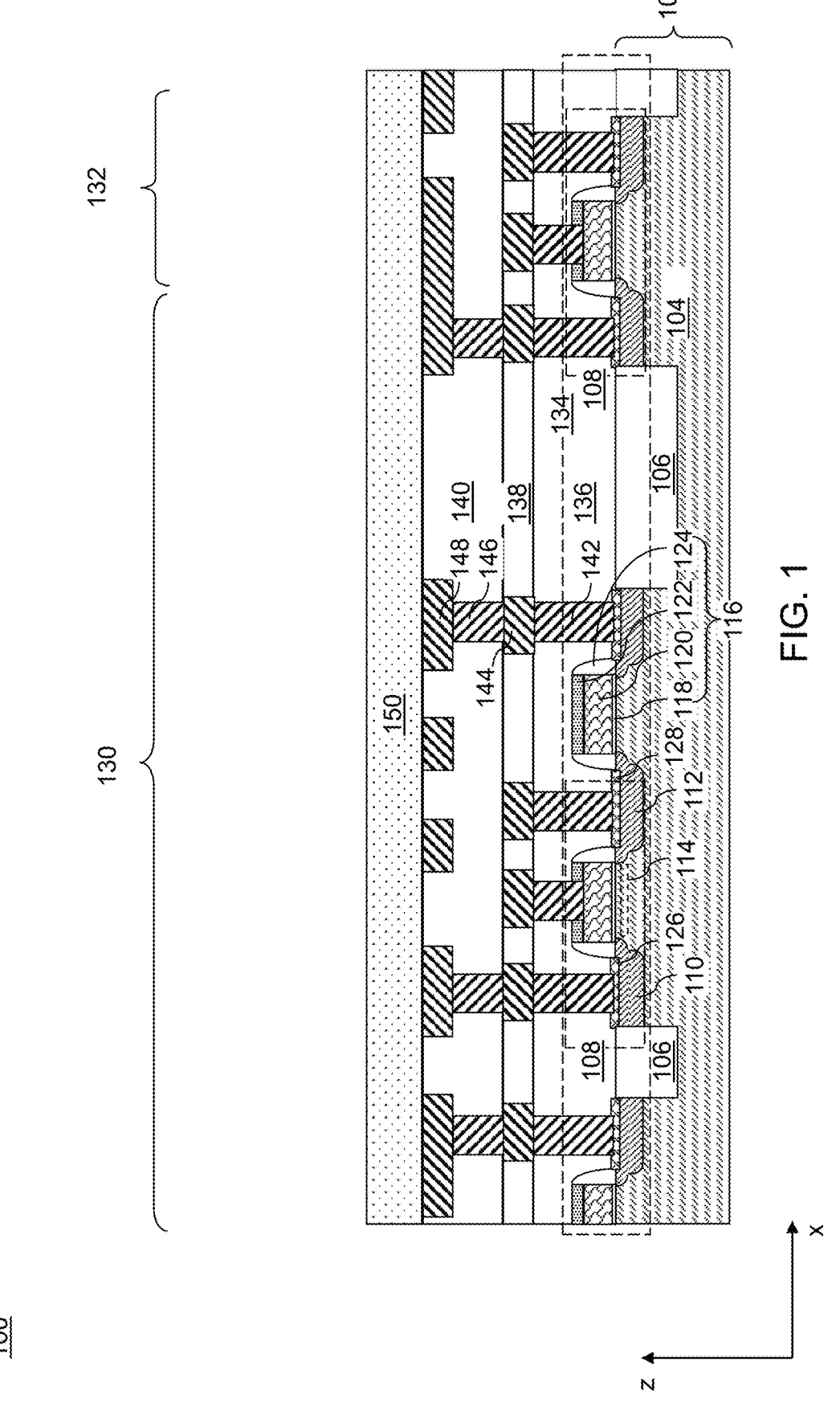
FIG. 1 is a vertical cross-sectional view of a first structure after formation of complementary metal-oxide-semiconductor (CMOS) transistors, first metal interconnect structures formed in lower-level dielectric material layers, and an isolation dielectric layer, according to various embodiments.

The following disclosure provides many different embodiments, or examples, for implementing different features of the provided subject matter. Specific examples of components and arrangements are described below to simplify this disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, this disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a common thickness range.

Various embodiments of this disclosure provide high-density capacitors and methods of forming the same that may be advantageous in terms of manufacturing flexibility, reduced size, and provide increased capacitance. In this regard, the high-density capacitor may be formed in a BEOL process and may be incorporated with other BEOL circuit components such as thin-film transistor (TFT) devices. As such, various embodiment high-density capacitors may include materials that may be processed at low temperatures. Thus, the fabrication of such capacitors may not damage previously fabricated devices (e.g., FEOL and MEOL devices). An embodiment high-density capacitor includes a bottom electrode having a plurality of non-concentric cylindrical portions each having a diameter that is less than or equal to 0.1 microns and a top electrode having vertical portions that are vertically surrounded by the non-concentric cylindrical portions of the bottom electrode. Further, the vertical portions are separated from one another by a separation distance that is also less than or equal to 0.2 microns. In some embodiments, the plurality of non-concentric cylindrical portions may have a spatial distribution that has a hexagonal symmetry that allows for close packing of the cylindrical portions. As such, the bottom electrode and the top electrode form a densely packed capacitor structure that is compatible with other circuit elements formed in BEOL processing operations.

An embodiment high-density capacitor includes a bottom electrode having a first cylindrical structure including a first inner shell and a first outer shell that is concentric with the first inner shell, a top electrode including a first vertical portion and a surrounding portion, a dielectric layer that separates the top electrode from the bottom electrode, and a barrier layer that separates the first inner shell of the bottom electrode from the first outer shell of the bottom electrode. The first vertical portion of the top electrode may be vertically surrounded by the first inner shell of the bottom electrode and the surrounding portion vertically surrounds the first outer shell of the bottom electrode. According to an embodiment, the bottom electrode may include a second cylindrical structure that is non-concentric with the first cylindrical structure, the second cylindrical structure including a second inner shell and a second outer shell that is concentric with the second inner shell, and the top electrode includes a second vertical portion that is vertically surrounded by the second inner shell of the bottom electrode and the surrounding portion vertically surrounds the second outer shell of the bottom electrode. The first vertical portion of the top electrode and the second vertical portion of the top electrode are separated from one another by a separation distance that is less than or equal to 0.2 microns.

In a further embodiment, a high-density capacitor may include a bottom electrode having a plurality of non-concentric cylindrical portions, a top electrode including a plurality of vertical portions and a surrounding portion, and a dielectric layer separating the top electrode from the bottom electrode. Each of the plurality of non-concentric cylindrical portions includes an inner shell and an outer shell and each of the plurality of vertical portions is vertically surrounded by the inner shell of a respective cylindrical portion of the bottom electrode. The surrounding portion of the top electrode respectively vertically surrounds each of the plurality of non-concentric cylindrical portions of the bottom electrode such that adjacent non-concentric cylindrical portions of the bottom electrode are separated from one another by the surrounding portion of the top electrode. At least some of the plurality of non-concentric cylindrical portions of the bottom electrode include a spatial distribution having a hexagonal symmetry.

In a further embodiment, a method of forming a high-density capacitor may include etching an interlayer dielectric layer to generate a plurality of pillar structures; depositing a first conductive material over the plurality of pillar structures and surrounding areas to generate a plurality of outer shells of a bottom electrode; etching the plurality of pillar structures to form a plurality of cavities in the plurality of pillar structures; depositing a second conductive material within the plurality of cavities to generate a plurality of inner shells of the bottom electrode; depositing a dielectric layer over the bottom electrode; and depositing a third conductive material over the dielectric layer to generate a plurality of vertical portions and a surrounding portion of a top electrode. The embodiment method may further include forming a barrier layer over the plurality of pillar structures and surrounding areas prior to depositing the first conductive material over the plurality of pillar structures and surrounding areas, electrically connecting the bottom electrode to a first interconnect structure formed below the high-density capacitor, and electrically connecting the top electrode to a second interconnect structure formed above the high-density capacitor.

FIG. 1 illustrates a semiconductor structure 100, according to various embodiments. The semiconductor structure 100 includes a substrate 102, which may be a semiconductor substrate such as a commercially available silicon substrate. The substrate 102 may include a semiconductor material layer 104 or at least an upper portion thereof. The semiconductor material layer 104 may be a surface portion of a bulk semiconductor substrate or may be a top semiconductor layer of a semiconductor-on-insulator (SOI) substrate. In one embodiment, the semiconductor material layer 104 may include a single crystalline semiconductor material such as single crystalline silicon. In one embodiment, the substrate 102 may include a single crystalline silicon substrate including a single crystalline silicon material.

Shallow trench isolation structures 106 including a dielectric material such as silicon oxide may be formed in an upper portion of the semiconductor material layer 104. Suitably doped semiconductor wells, such as p-type wells and n-type wells, may be formed within each area that is laterally enclosed by a portion of the shallow trench isolation structures 106. Field effect transistors 108 may be formed over a top surface of the semiconductor material layer 104. For example, each of the field effect transistors 108 may include a source electrode 110, a drain electrode 112, a semiconductor channel 114 that includes a surface portion of the substrate 102 extending between the source electrode 110 and the drain electrode 112, and a gate structure 116. The semiconductor channel 114 may include a single crystalline semiconductor material.

Each gate structure 116 may include a gate dielectric layer 118, a gate electrode 120, a gate cap dielectric 122, and a dielectric gate spacer 124. A source-side metal-semiconductor alloy region 126 may be formed on each source electrode 110, and a drain-side metal-semiconductor alloy region 128 may be formed on each drain electrode 112. The devices formed on the top surface of the semiconductor material layer 104 may include complementary metal-oxide-semiconductor (CMOS) transistors and optionally additional semiconductor devices (such as resistors, diodes, capacitors, etc.), and are collectively referred to as CMOS circuitry 134.

The semiconductor structure 100 of FIG. 1 may include a memory array region 130 in which an array of memory cells may be subsequently formed. The first exemplary structure may further include a peripheral region 132 in which metal wiring for the array of memory devices is provided. Generally, the field effect transistors 108 in the CMOS circuitry 134 may be electrically connected to an electrode of a respective memory cell by a respective set of metal interconnect structures.

Devices (such as field effect transistors 108) in the peripheral region 132 may provide functions that operate the array of memory cells to be subsequently formed. Specifically, devices in the peripheral region may be configured to control the programming operation, the erase operation, and the sensing (read) operation of the array of memory cells. For example, the devices in the peripheral region 132 may include a sensing circuitry and/or a programming circuitry.

One or more of the field effect transistors 108 in the CMOS circuitry 134 may include a semiconductor channel 114 that contains a portion of the semiconductor material layer 104 in the substrate 102. In embodiments in which the semiconductor material layer 104 includes a single crystalline semiconductor material such as single crystalline silicon, the semiconductor channel 114 of each of the field effect transistors 108 in the CMOS circuitry 134 may include a single crystalline semiconductor channel such as a single crystalline silicon channel. In one embodiment, a plurality of field effect transistors 108 in the CMOS circuitry 134 may include a respective node that is subsequently electrically connected to a node of a respective memory cell to be subsequently formed. For example, a plurality of field effect transistors 108 in the CMOS circuitry 134 may include a respective source electrode 110 or a respective drain electrode 112 that is subsequently electrically connected to a node of a respective memory cell to be subsequently formed.

In one embodiment, the CMOS circuitry 134 may include a programming control circuit configured to control gate voltages of a set of field effect transistors 108 that may be used for programming a respective memory cell (e.g., a ferroelectric memory cell) and to control gate voltages of transistors (e.g., thin-film transistors) to be subsequently formed. In this embodiment, the programming control circuit may be configured to provide a first programming pulse that programs a respective ferroelectric dielectric material layer in a selected ferroelectric memory cell into a first polarization state in which electrical polarization in the ferroelectric dielectric material layer points toward a first electrode of the selected ferroelectric memory cell, and to provide a second programming pulse that programs the ferroelectric dielectric material layer in the selected ferroelectric memory cell into a second polarization state in which the electrical polarization in the ferroelectric dielectric material layer points toward a second electrode of the selected ferroelectric memory cell.

In one embodiment, the substrate 102 may include a single crystalline silicon substrate, and the field effect transistors 108 may include a respective portion of the single crystalline silicon substrate as a semiconducting channel. As used herein, a "semiconducting" element refers to an element having electrical conductivity in the range from 1.0× $10^{-6}$ S/cm to 1.0×$10^5$ S/cm. As used herein, a "semiconductor material" refers to a material having electrical conductivity in the range from 1.0×$10^{-6}$ S/cm to 1.0×$10^5$ S/cm in the absence of electrical dopants therein and is capable of producing a doped material having electrical conductivity in a range from 1.0 S/cm to 1.0×$10^5$ S/cm upon suitable doping with an electrical dopant.

According to an embodiment, the field effect transistors 108 may be subsequently electrically connected to drain electrodes and gate electrodes of access transistors including semiconducting metal oxide plates to be formed above the field effect transistors 108. In one embodiment, a subset of the field effect transistors 108 may be subsequently electrically connected to at least one of the drain electrodes and the gate electrodes. For example, the field effect transistors 108 may include first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 108 may include bit line drivers configured to apply a bit line bias voltage to bit lines to be subsequently formed, and sense amplifiers configured to detect electrical current that flows through the bit lines during a read operation.

Various metal interconnect structures formed within dielectric material layers may be subsequently formed over the substrate 102 and the semiconductor devices thereupon (such as field effect transistors 108). In an illustrative example, the dielectric material layers may include, for example, a first dielectric material layer 136 that may be a layer that vertically surrounds the contact structure connected to the source and drains (sometimes referred to as a contact-level dielectric material layer), a first interconnect-level dielectric material layer 138, and a second interconnect-level dielectric material layer 140. The metal interconnect structures may include device contact via structures 142 formed in the first dielectric material layer 136 and contacting a respective component of the CMOS circuitry 134, first metal line structures 144 formed in the first interconnect-level dielectric material layer 138, first metal via structures 146 formed in a lower portion of the second interconnect-level dielectric material layer 140, and second metal line structures 148 formed in an upper portion of the second interconnect-level dielectric material layer 140.

Each of the dielectric material layers (136, 138, 140) may include a dielectric material such as undoped silicate glass, a doped silicate glass, organosilicate glass, amorphous fluorinated carbon, porous variants thereof, or combinations thereof. Each of the metal interconnect structures (142, 144, 146, 148) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, TiN, alloys thereof, and/or combinations thereof.

Other suitable metallic liner and metallic fill materials within the contemplated scope of disclosure may also be used. In one embodiment, the first metal via structures 146 and the second metal line structures 148 may be formed as integrated line and via structures by a dual damascene process. The dielectric material layers (136, 138, 140) are herein referred to as lower-level dielectric material layers. The metal interconnect structures (142, 144, 146, 148) formed within the lower-level dielectric material layers are herein referred to as lower-level metal interconnect structures.

While the disclosure is described using an embodiment in which an array of memory cells may be formed over the second line-and-via-level dielectric material layer 140, embodiments are expressly contemplated herein in which the array of memory cells may be formed at a different metal interconnect level.

An array of thin-film transistors and an array of ferroelectric memory cells (or other types of memory cells) may be subsequently deposited over the dielectric material layers (136, 138, 140) that have formed therein the metal interconnect structures (142, 144, 146, 148). The set of all dielectric material layers that are formed prior to formation of an array of thin-film transistors or an array of ferroelectric memory cells is collectively referred to as lower-level dielectric material layers (136, 138, 140). The set of all metal interconnect structures that is formed within the lower-level dielectric material layers (136, 138, 140) is herein referred to as first metal interconnect structures (142, 144, 146, 148). Generally, first metal interconnect structures (142, 144, 146, 148) formed within at least one lower-level dielectric material layer (136, 138, 140) may be formed over the semiconductor material layer 104 that is located in the substrate 102.

According to an embodiment, thin-film transistors may be subsequently formed in a metal interconnect level that overlies metal interconnect levels that contain the lower-level dielectric material layers (136, 138, 140) and the first metal interconnect structures (142, 144, 146, 148). In one embodiment, a planar dielectric material layer having a uniform thickness may be formed over the lower-level dielectric material layers (136, 138, 140). The planar dielectric material layer is herein referred to as an insulating matrix layer 150. The insulating matrix layer 150 may include a dielectric material such as undoped silicate glass, a doped silicate glass, organosilicate glass, or a porous dielectric material, and may be deposited by chemical vapor deposition. The thickness of the insulating matrix layer 150 may be in a range from 20 nm (i.e., 200 angstrom) to 300 nm (i.e., 3000 angstrom), although lesser and greater thicknesses may also be used.

Generally, interconnect-level dielectric layers (such as the lower-level dielectric material layer (136, 138, 140)) containing therein the metal interconnect structures (such as the first metal interconnect structures (142, 144, 146, 148)) may be formed over semiconductor devices. The insulating matrix layer 150 may be formed over the interconnect-level dielectric layers. Other passive devices may be formed in BEOL processes. For example various capacitors, inductors, resistors, and integrated passive devices may be utilized with other BEOL devices.

Figures 2A, 2B:
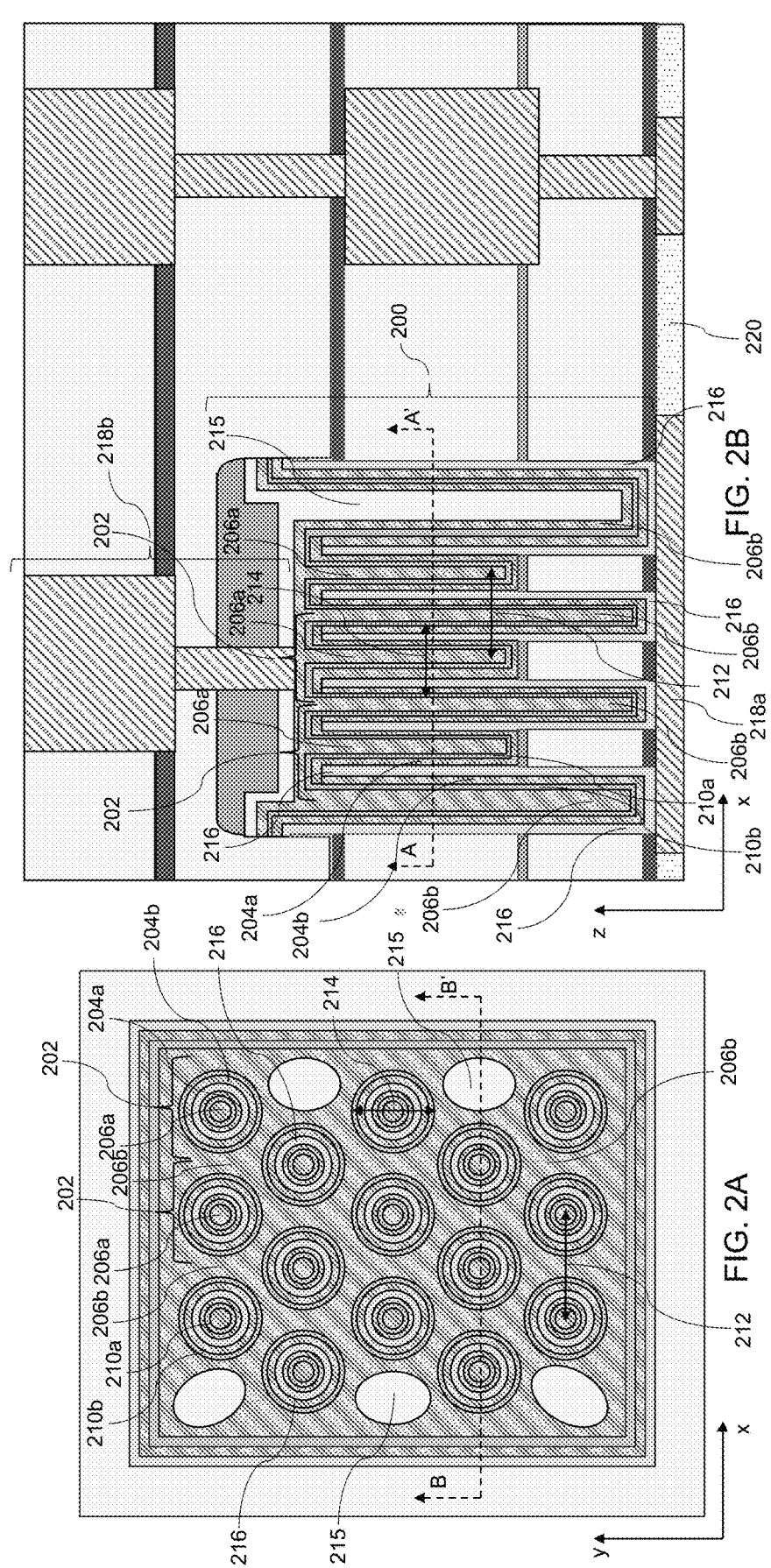
FIG. 2A is a horizontal cross-sectional view of a high-density capacitor that may be formed in a BEOL process, according to various embodiments.
FIG. 2B is a vertical cross-sectional view of the high-density capacitor of FIG. 2A, according to various embodiments.

FIG. 2A is a horizontal cross-sectional view of a high-density capacitor 200 that may be formed in a BEOL process, and FIG. 2B is a vertical cross-sectional view of the high-density capacitor 200 of FIG. 2A, according to various embodiments. The plane defining the horizontal cross-sectional view of FIG. 2A is indicated by the cross section A-A' in FIG. 2B and the plane defining the vertical cross-sectional view of FIG. 2B is indicated by the cross section B-B' in FIG. 2A. The high-density capacitor 200 may be formed over one or more interconnect-level dielectric layers (such as the lower-level dielectric material layer (136, 138, 140)) containing metal interconnect structures (such as the first metal interconnect structures (142, 144, 146, 148)). For example, the high-density capacitor 200 may be formed over the insulating matrix layer 150 (e.g., see FIG. 1) or over one or more additional interconnect layers formed over the insulating matrix layer 150, as described in greater detail, below.

As shown in FIGS. 2A and 2B, the high-density capacitor 200 may include a bottom electrode (204*a*, 204*b*) having a plurality of non-concentric cylindrical portions 202 that are not concentric with one another. Each of the plurality of non-concentric cylindrical portions 202 may include an inner shell 204*a* and an outer shell 204*b* that is concentric with the inner shell 204*a*. In various embodiments, the inner shell 204*a* and the outer shell 204*b* may each include a conductive material having a thickness that is less than or equal to 10 nm. The high-density capacitor 200 may also include a top electrode (206*a*, 206*b*) having a plurality of vertical portions 206*a* and a surrounding portion 206*b*. According to various embodiments, the bottom electrode (204*a*, 204*b*) and the top electrode (206*a*, 206*b*) each include an electrically conducting material such as one or more of TiN, TaN, WN, TiC, TaC, or WC. Other embodiments may include various other conducting materials.

As shown in FIGS. 2A and 2B, each of the plurality of vertical portions 206*a* of the top electrode (206*a*, 206*b*) may be vertically surrounded by the inner shell 204*a* of a respective cylindrical portion 202 of the bottom electrode (204*a*, 204*b*) and the surrounding portion 206*b* of the top electrode (206*a*, 206*b*) respectively vertically surrounds each of the plurality of non-concentric cylindrical portions 202 of the bottom electrode (204*a*, 204*b*). In this regard, adjacent non-concentric cylindrical portions 202 of the bottom electrode (204*a*, 204*b*) may be separated from one another by the surrounding portion 206*b* of the top electrode (206*a*, 206*b*). In various embodiments, adjacent ones of the plurality of vertical portions 206*a* may be separated from one another by a separation distance 212 that may be less than or equal to 0.2 microns.

A dielectric layer (210*a*, 210*b*) may separate the top electrode (206*a*, 206*b*) from the bottom electrode (204*a*, 204*b*). In this regard, the dielectric layer (210*a*, 210*b*) may include a first concentric portion 210*a* that separates each of the plurality of vertical portions 206*a* of the top electrode (206*a*, 206*b*) from the inner shell 204*a* of the bottom electrode (204*a*, 204*b*) and a second concentric portion 210*b* that separates the outer shell 204*b* of the bottom electrode (204*a*, 204*b*) from the surrounding portion 206*b* of the top electrode (206*a*, 206*b*). In various embodiments, a diameter 214 of the second concentric portion 210*b* may be less than or equal to 0.2 microns. In various embodiments, dielectric layer (210*a*, 210*b*) may include a high-k dielectric material including one or more of hafnium oxide, hafnium silicon oxide, hafnium tantalum oxide, hafnium titanium oxide, hafnium zirconium oxide, zirconium oxide, titanium oxide, aluminum oxide, and hafnium dioxide-alumina. As shown in FIG. 2A, at least some of the plurality of non-concentric cylindrical portions 202 of the bottom electrode (204*a*, 204*b*) may include a spatial distribution having a hexagonal symmetry. In various other embodiments, the plurality of non-concentric cylindrical portions 202 may be arranged to have a spatial distribution having various other symmetries or no specific symmetry. As shown in FIGS. 2A and 2B, in certain embodiments, one or more dielectric spacer regions 215 may be formed when a plurality of non-concentric cylindrical portions 202 having a first symmetry (e.g., hexagonal) is placed in a region having a second symmetry (e.g., rectangular), as described in greater detail with reference to FIGS. 14A and 14B, below.

As shown in FIGS. 2A and 2B, the high-density capacitor 200 may further include a barrier layer 216 that separates the inner shell 204*a* of the bottom electrode (204*a*, 204*b*) from the outer shell 204*b* of the bottom electrode (204*a*, 204*b*). The barrier layer 216 may include an electrically conductive material such as Ta and/or TaN. As such, the barrier layer 216 may form an electrically conducting connection with the bottom electrode (204*a*, 204*b*). Further, as shown in FIG. 2B, the barrier layer 216 may form an electrically conducting connection with a first interconnect structure 218*a*. In this way, the bottom electrode (204*a*, 204*b*) may be electrically connected to the first interconnect structure 218*a* that may be disposed below the high-density capacitor 200. In this way, the high-density capacitor 200 may be disposed over an interlayer dielectric layer 220 that includes an interconnect structure 218*a*. Similarly, the top electrode (206*a*, 206*b*) may be electrically connected to a second interconnect structure 218*b* formed above the high-density capacitor 200.

The specific arrangement of non-concentric cylindrical portions 202 in the high-density capacitor 200 of FIGS. 2A and 2B is provided as merely one example embodiment. Various other embodiments may include a bottom electrode (204*a*, 204*b*) including greater or fewer non-concentric cylindrical portions 202 that may have different spatial configurations. For example, the embodiment high-density capacitor 200 includes plurality of non-concentric cylindrical portions 202 that includes fifteen non-concentric cylindrical portions 202. Further, the plurality of non-concentric cylindrical portions 202 may be arranged such that at least some of the plurality of non-concentric cylindrical portions 202 of the bottom electrode (204*a*, 204*b*) have a spatial distribution having a hexagonal symmetry as shown, for example, in FIG. 2A.

Other embodiments may include other numbers of non-concentric cylindrical portions 202 arranged in various ways, with or without, a specific symmetry (e.g., square, rectangular, etc.). For example, some embodiments may include a bottom electrode (204*a*, 204*b*) including a single cylindrical portion 202, two non-concentric cylindrical portions 202, three non-concentric cylindrical portions 202, etc. Each such embodiment may include a top electrode (206*a*, 206*b*) that has a corresponding number of vertical portions 206*a* (e.g., one vertical portion 206*a*, two vertical portions 206*a*, three vertical portions 206*a*, etc., respectively) and a surrounding portion 206*b*. Further, other embodiments may include non-concentric cylindrical portions 202 having different configurations. For example, while each of the above-described embodiments include non-concentric cylindrical portions 202 having an inner shell 204*a* and an outer shell 204*b*, other embodiments may not be so limited. For example, other embodiments may include non-concentric cylindrical portions 202 having an inner shell 204*a*, an outer shell 204*b*, and one or more additional shells (not shown) formed between the inner shell 204*a* and the outer shell 204*b*. For example, non-concentric cylindrical portions 202 may include three shells, four shells, etc.

These additional embodiments may further include one or more dielectric layers 210 separating the bottom electrode (204*a*, 204*b*) from the top electrode (206*a*, 206*b*) and one or more barrier layers 216 separating one or more of the bottom electrode (204*a*, 204*b*) and the top electrode (206*a*, 206*b*) from one or more interconnect structures (218*a*, 218*b*) respectively formed below or above the high-density capacitor 200. In still further embodiments, the bottom electrode (204a, 204b) and the top electrode (206a, 206b) may both be electrically connected to interconnect structures 218a formed below the high-density capacitor 200 or the bottom electrode (204a, 204b) and the top electrode (206a, 206b) may both be electrically connected to interconnect structures 218b formed above the high-density capacitor 200. The above-described embodiments, including the high-density capacitor 200 and variations including different numbers and configurations of cylindrical portions, may be formed using operations described in greater detail with reference to FIGS. 3A to 23B, below.

Figures 3A, 3B:
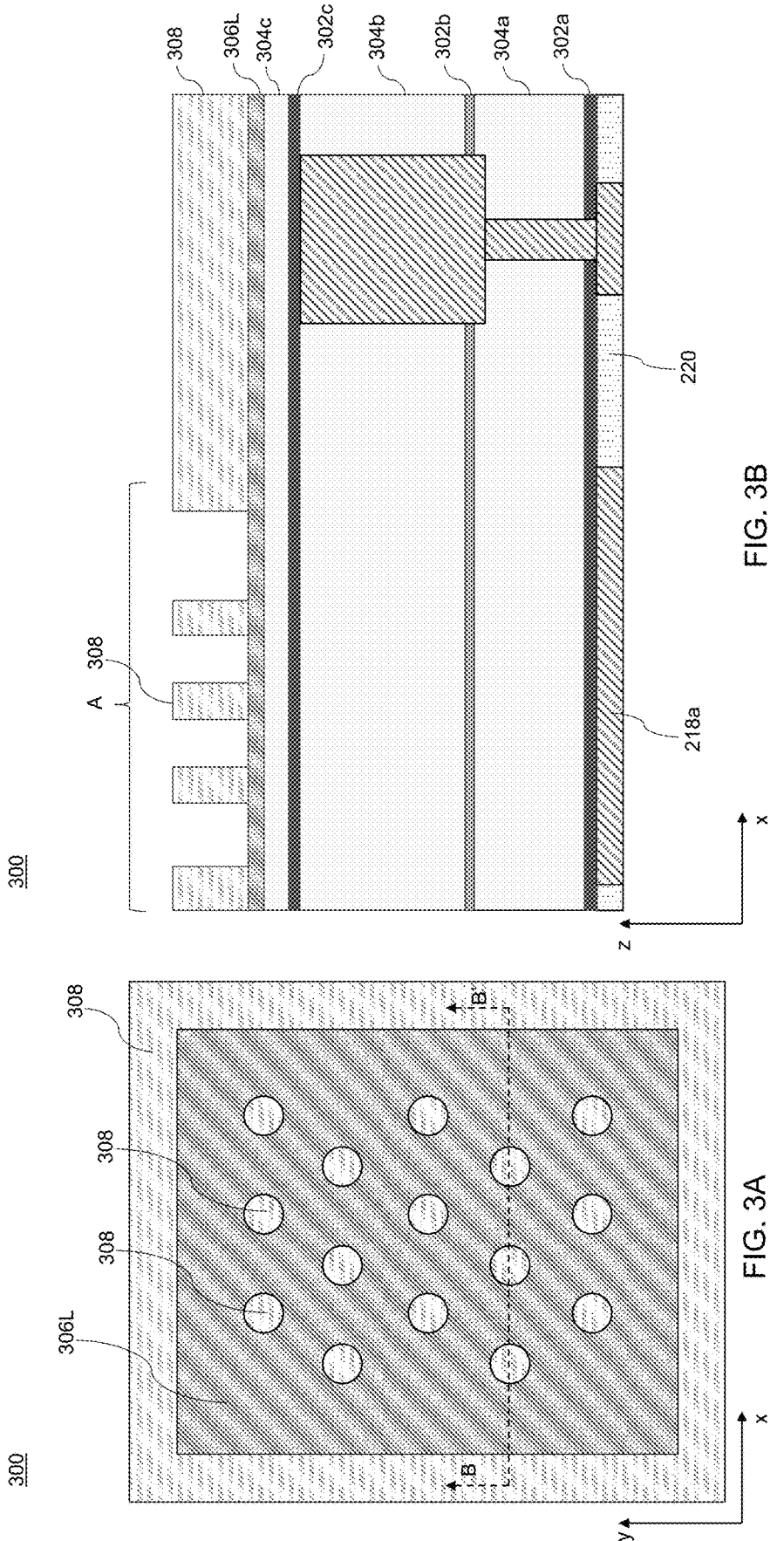
FIG. 3A is a top view of an intermediate structure that may be used in the formation of a high-density capacitor, according to various embodiments.
FIG. 3B is a vertical cross-sectional view of the intermediate structure of FIG. 3A, according to various embodiments.

FIG. 3A is a top view of an intermediate structure 300 that may be used in the formation of a high-density capacitor (200, 2200), and FIG. 3B is a vertical cross-sectional view of the intermediate structure 300 of FIG. 3A, according to various embodiments. The plane defining the vertical cross-sectional view of FIG. 3B is indicated by the cross section B-B' in FIG. 3A and the region of the intermediate structure 300 shown in the top view of FIG. 3A is indicated by the brace labeled "A" in FIG. 3B. The intermediate structure 300 may include an interlayer dielectric layer 220, a first boundary layer 302a, a first dielectric layer 304a, a second boundary layer 302b, a second dielectric layer 304b, a third boundary layer 302c, and a third dielectric layer 304c. The intermediate structure 300 may further include a hard mask layer 306L and a patterned photoresist 308.

The interlayer dielectric layer 220, the first boundary layer 302a, the first dielectric layer 304a, the second boundary layer 302b, the second dielectric layer 304b, the third boundary layer 302c, the third dielectric layer 304c, and the hard mask layer 306L may each be formed as a planar blanket (i.e., un-patterned) layer having a respective planar top surface and a respective planar bottom surface. The intermediate structure 300 may be formed in a BEOL process. As such, the interlayer dielectric layer 220 may be a dielectric layer (e.g., an inter-layer dielectric or insulating matrix layer 150 from FIG. 1) that may embed one or more interconnect structures 218a. The one or more interconnect structures 218a may be electrically connected to various interconnect structures (e.g., metal interconnect structures (142, 144, 146, 148) in FIG. 1) formed below the interlayer dielectric layer 220. The one or more interconnect structures 218a may include at least one conductive material, which may be a combination of a metallic liner layer (such as a metallic nitride or a metallic carbide) and a metallic fill material. Each metallic liner layer may include TiN, TaN, WN, TIC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used.

Each of the interlayer dielectric layer 220, the first dielectric layer 304a, the second dielectric layer 304b, and the third dielectric layer 304c may include, for example, undoped silicate glass, a doped silicate glass (e.g., deposited by decomposition of tetraethylorthosilicate (TEOS)), organosilicate glass, silicon oxynitride, or silicon carbide nitride. Other dielectric materials are within the contemplated scope of disclosure. The dielectric material of the interlayer dielectric layer 220, the first dielectric layer 304a, the second dielectric layer 304b, and the third dielectric layer 304c may be deposited by a conformal deposition process (such as a chemical vapor deposition process) or a self-planarizing deposition process (such as spin coating). The thickness of the interlayer dielectric layer 220, the first dielectric layer 304a, the second dielectric layer 304b, and the third dielectric layer 304c may each be in a range from approximately 15 nm to approximately 60 nm, such as from approximately 20 nm to approximately 40 nm, although smaller and larger thicknesses may also be used.

Each of the first boundary layer 302a, the second boundary layer 302b, and the third boundary layer 302c may include an etch stop material such as silicon nitride, silicon carbide, silicon nitride carbide, or a dielectric metal oxide (such as aluminum oxide, titanium oxide, tantalum oxide, etc.). In an example embodiment, the first boundary layer 302a and the third boundary layer 302c may include silicon carbide and the second boundary layer 302b may include silicon nitride. The first boundary layer 302a, the second boundary layer 302b, and the third boundary layer 302c may be deposited by a conformal or non-conformal deposition process. In one embodiment, the first boundary layer 302a, the second boundary layer 302b, and the third boundary layer 302c may be deposited by chemical vapor deposition, atomic layer deposition, or physical vapor deposition. The thickness of the first boundary layer 302a, the second boundary layer 302b, and the third boundary layer 302c may each be in a range from approximately 2 nm to approximately 20 nm, such as from approximately 3 nm to approximately 12 nm, although smaller and larger thicknesses may also be used.

The hard mask layer 306L may include a conductive material such as TiN. Alternatively, the hard mask layer 306L may include any suitable material, such as amorphous carbon, amorphous hydrogenated carbon, organo-siloxane based materials, SiN, SiON or combinations thereof. The hard mask layer 306L may be formed as a planar blanket (i.e., un-patterned) layer having a planar top surface and a planar bottom surface, and may be formed using chemical vapor deposition, physical vapor deposition, atomic layer deposition or any other suitable process. The patterned photoresist 308 may be formed by depositing a blanket layer (not shown) of photoresist material that may then be patterned using lithographic techniques. The patterned photoresist 308 may then be used as a mask while patterning the hard mask layer 306L to form a patterned hard mask 306, as described in further detail with reference to a FIGS. 4A and 4B, below. As shown in FIG. 3A, for example, the patterned photoresist 308 may expose a rectangular portion of the hard mask layer 306L while covering a plurality of circular regions of the hard mask layer 306L. As shown, at least some of the circular regions may have a spatial distribution having a hexagonal symmetry.

Figures 4A, 4B:
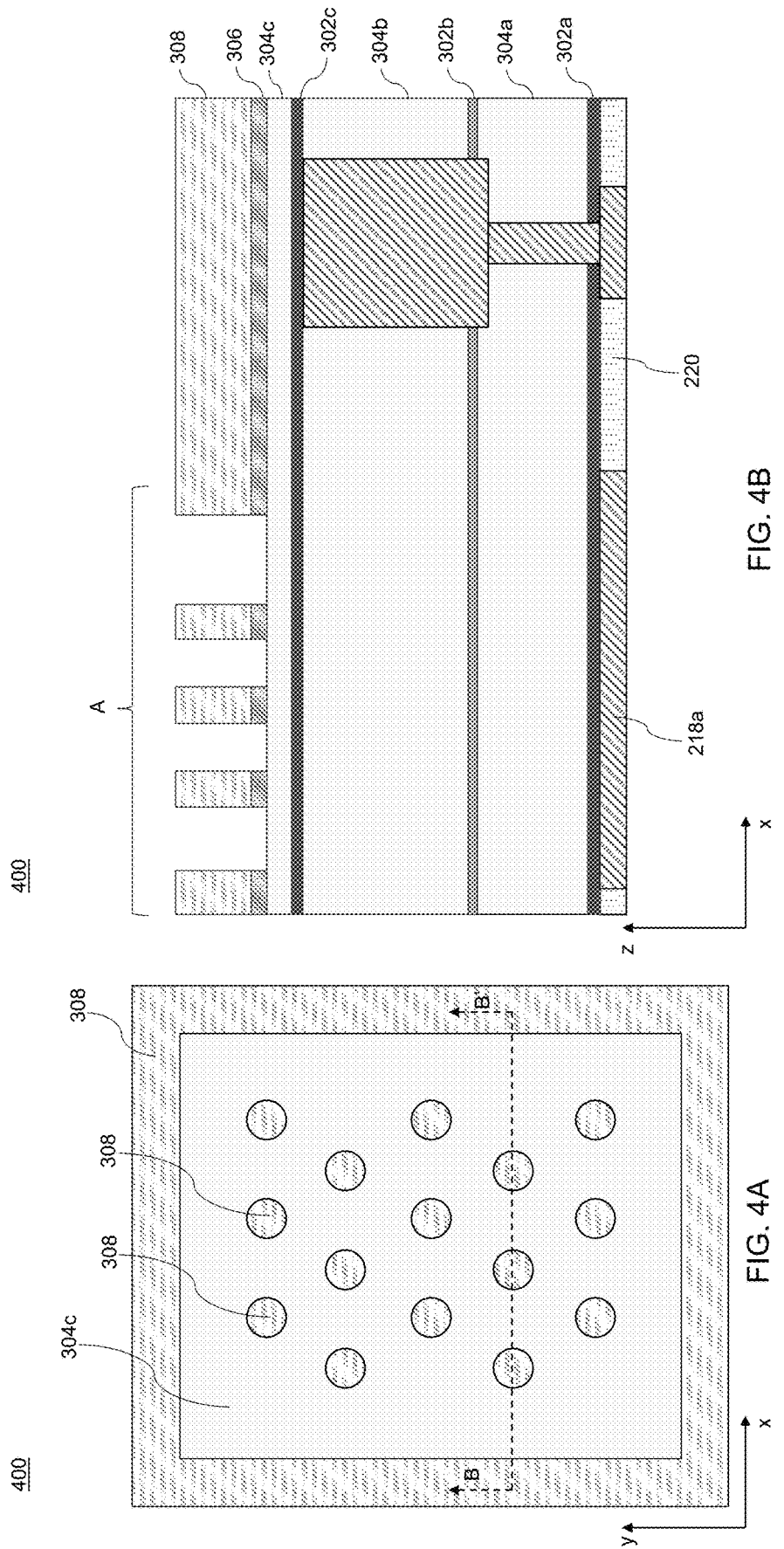
FIG. 4A is a top view of a further intermediate structure that may be used in the formation of a high-density capacitor, according to various embodiments.
FIG. 4B is a vertical cross-sectional view of the intermediate structure of FIG. 4A, according to various embodiments.

FIG. 4A is a top view of a further intermediate structure 400 that may be used in the formation of a high-density capacitor (200, 2200), and FIG. 4B is a vertical cross-sectional view of the intermediate structure 400 of FIG. 4A, according to various embodiments. The plane defining the vertical cross-sectional view of FIG. 4B is indicated by the cross section B-B' in FIG. 4A and the region of the intermediate structure 400 shown in the top view of FIG. 4A is indicated by the brace labeled "A" in FIG. 4B. The intermediate structure 400 may be formed from the intermediate structure 300 of FIGS. 3A and 3B by performing an anisotropic etch of the hard mask layer 306L that is selective to the third dielectric layer 304c. As such, a patterned hard mask 306 may be formed. As shown in FIG. 4A, the process of etching the hard mask layer 306L may generate the patterned hard mask 306 to have an exposed rectangular area and a plurality of circular masked regions corresponding to the circular masked regions of the patterned photoresist 308. The patterned hard mask 306 may then be used to further etch the structure as described in greater detail with reference to FIGS. 5A and 5B, below.

Figures 5A, 5B:
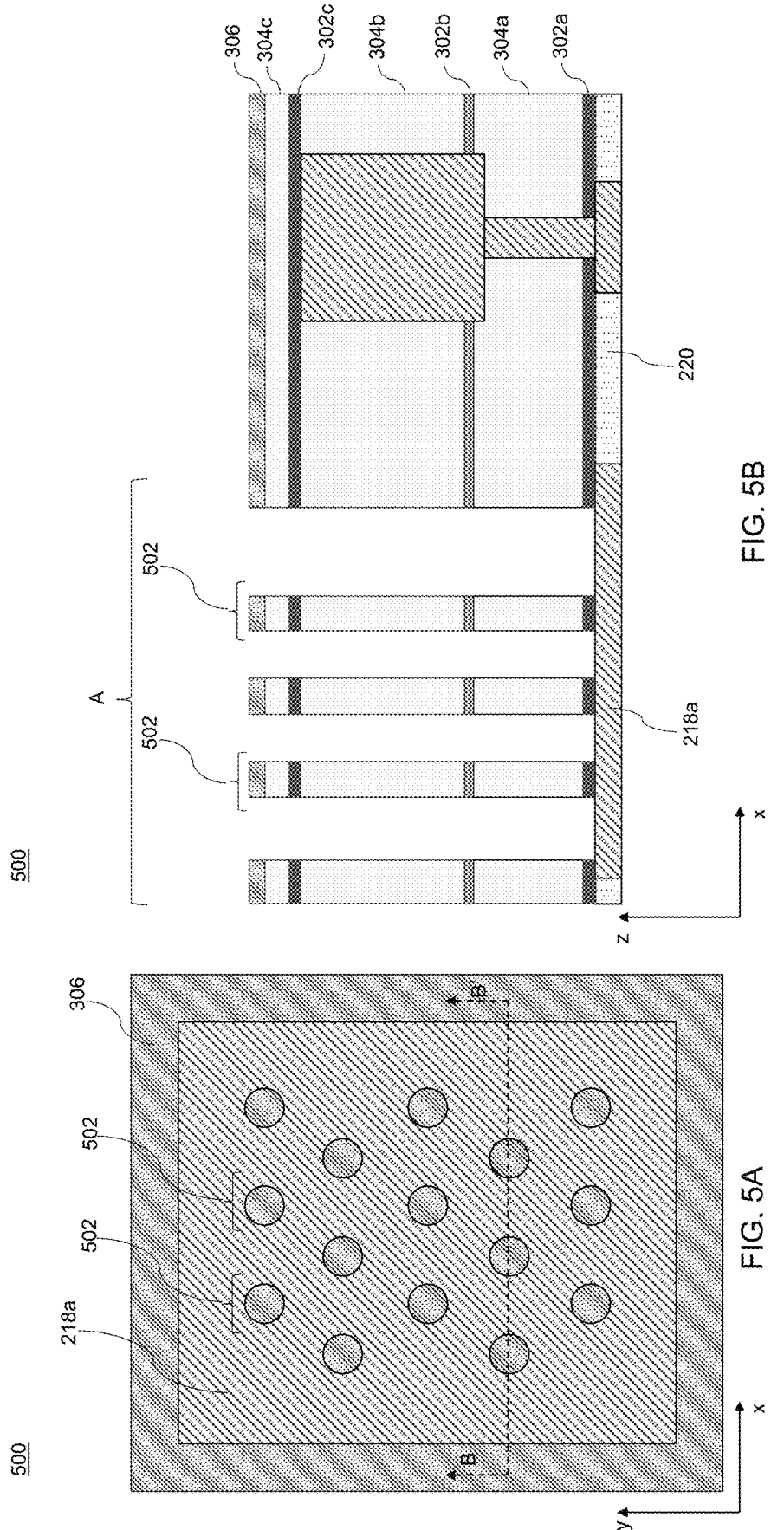
FIG. 5A is a top view of a further intermediate structure that may be used in the formation of a high-density capacitor, according to various embodiments.
FIG. 5B is a vertical cross-sectional view of the intermediate structure of FIG. 5A, according to various embodiments.

FIG. 5A is a top view of a further intermediate structure 500 that may be used in the formation of a high-density capacitor (200, 2200), and FIG. 5B is a vertical cross-sectional view of the intermediate structure 500 of FIG. 5A, according to various embodiments. The plane defining the vertical cross-sectional view of FIG. 5B is indicated by the cross section B-B' in FIG. 5A and the region of the intermediate structure 500 shown in the top view of FIG. 5A is indicated by the brace labeled "A" in FIG. 5B. The intermediate structure 500 may be formed from the intermediate structure 400 of FIGS. 4A and 4B by using the patterned hard mask 306 to etch the intermediate structure 400. In this regard, an anisotropic etch process may be performed to etch through the third dielectric layer 304c, the third boundary layer 302c, the second dielectric layer 304b, the second boundary layer 302b, the first dielectric layer 304a, and the first boundary layer 302a. As such, the etching process may generate a plurality of pillar structure 502 in an otherwise exposed rectangular potion of the first interconnect structure 218a.

Figures 6A, 6B:
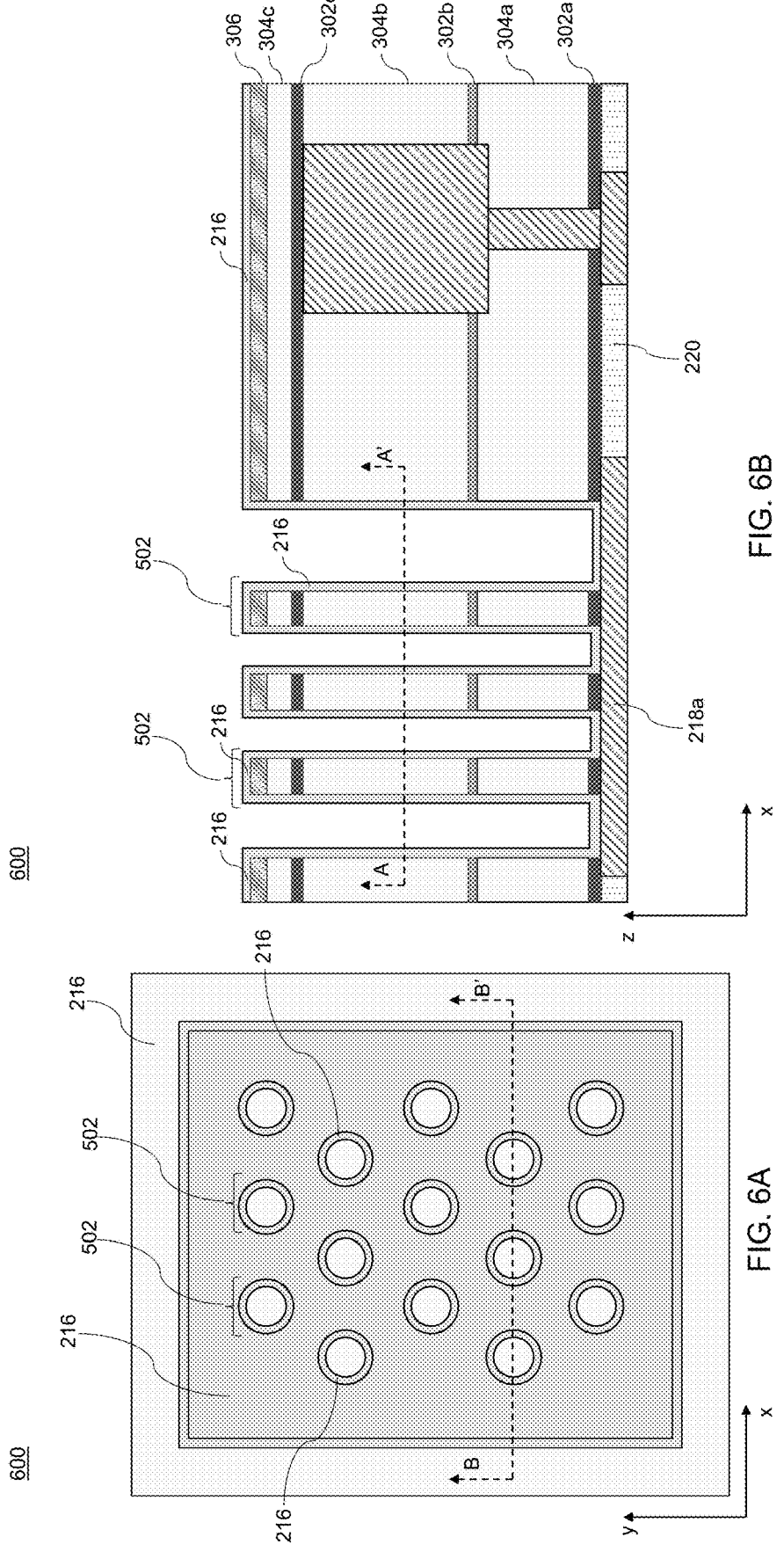
FIG. 6A is a horizontal cross-sectional view of a further intermediate structure that may be used in the formation of a high-density capacitor, according to various embodiments.
FIG. 6B is a vertical cross-sectional view of the intermediate structure of FIG. 6A, according to various embodiments.

FIG. 6A is a horizontal cross-sectional view of a further intermediate structure 600 that may be used in the formation of a high-density capacitor, and FIG. 6B is a vertical cross-sectional view of the intermediate structure 600 of FIG. 6A, according to various embodiments. The plane defining the horizontal cross-sectional view of FIG. 6A is indicated by the cross section A-A' in FIG. 6B and the plane defining the vertical cross-sectional view of FIG. 6B is indicated by the cross section B-B' in FIG. 6A. The intermediate structure 600 may be formed from the intermediate structure 500 of FIGS. 5A and 5B by removing the patterned photoresist 308 and forming a barrier layer 216 over the resulting structure. In this regard, the patterned photoresist 308 may be removed by ashing or by dissolution with a solvent.

The barrier layer 216 may include an electrically conductive material such as Ta and/or TaN. In other embodiments, the barrier layer 216 may include various other electrically conducting layers such as TIN, WN, TiC, TaC, and/or WC. Other suitable conductive materials within the contemplated scope of this disclosure may also be used. The barrier layer 216 may be deposited to form an electrically conductive contact with the first interconnect structure 218a. The barrier layer 216 may be deposited by a conformal or non-conformal deposition process. In one embodiment, the barrier layer 216 may be deposited by chemical vapor deposition, atomic layer deposition, or physical vapor deposition. The thickness of the barrier layer 216 may be in a range from approximately 2 nm to approximately 20 nm, such as from approximately 3 nm to approximately 12 nm, although smaller and larger thicknesses may also be used. For example, in certain embodiments, the barrier layer 216 may have a thickness that is less than 10 nm.

Figures 7A, 7B:
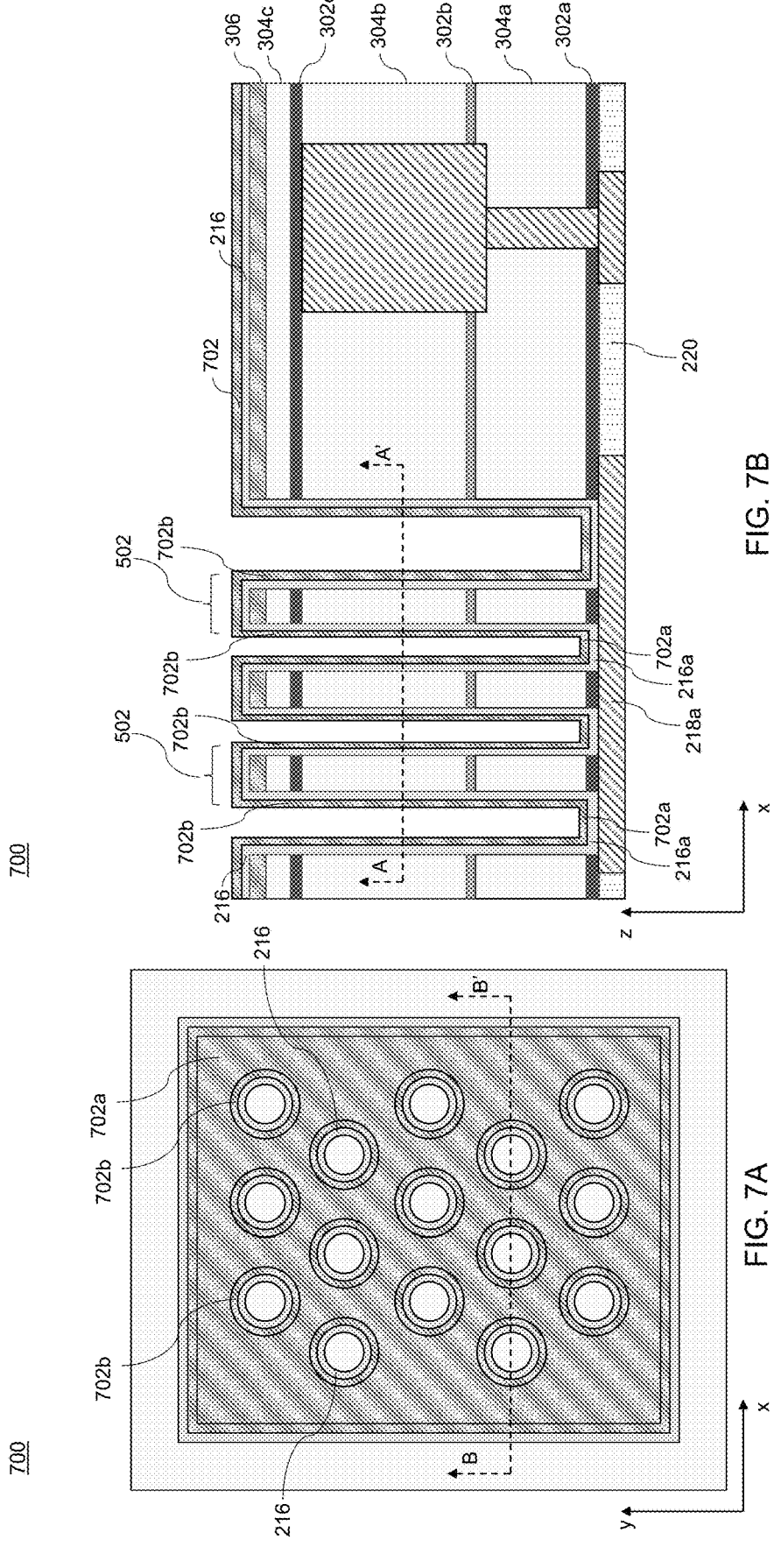
FIG. 7A is a horizontal cross-sectional view of a further intermediate structure that may be used in the formation of a high-density capacitor, according to various embodiments.
FIG. 7B is a vertical cross-sectional view of the intermediate structure of FIG. 7A, according to various embodiments.

FIG. 7A is a horizontal cross-sectional view of a further intermediate structure 700 that may be used in the formation of a high-density capacitor, and FIG. 7B is a vertical cross-sectional view of the intermediate structure 700 of FIG. 7A, according to various embodiments. The plane defining the horizontal cross-sectional view of FIG. 7A is indicated by the cross section A-A' in FIG. 7B and the plane defining the vertical cross-sectional view of FIG. 7B is indicated by the cross section B-B' in FIG. 7A. The intermediate structure 700 may be formed from the intermediate structure 600 of FIGS. 6A and 6B by depositing a first electrically conducting layer 702 over the intermediate structure 600. The first electrically conducting layer 702 may include a conductive metallic nitride or a conductive metallic carbide such as TIN, TaN, WN, TiC, TaC, and/or WC. Other suitable conductive materials within the contemplated scope of this disclosure may also be used. The first electrically conducting layer 702 may be deposited so as to form an electrically conductive contact with the barrier layer 216.

The first electrically conducting layer 702 may be further processed to generate portions of the bottom electrode (204a, 204b) described above with reference to FIGS. 2A and 2B. For example, flat horizontal portions 702a of the first electrically conducting layer 702 may be formed over corresponding flat horizontal portions 216a of the barrier layer 216. In turn, such flat horizontal portions 216a of the barrier layer may form electrically conducting contacts with the first interconnect structure 218a. Similarly, cylindrical portions 702b of the first electrically conducting layer 702 may be formed over cylindrical sidewalls of the pillar structures 502. Upon further processing, such cylindrical portions 702b of the first electrically conducting layer 702 may form the outer shell 204b of respective non-concentric cylindrical portions 202 of the bottom electrode (204a, 204b) described above with reference to FIGS. 2A and 2B.

Figures 8A, 8B:
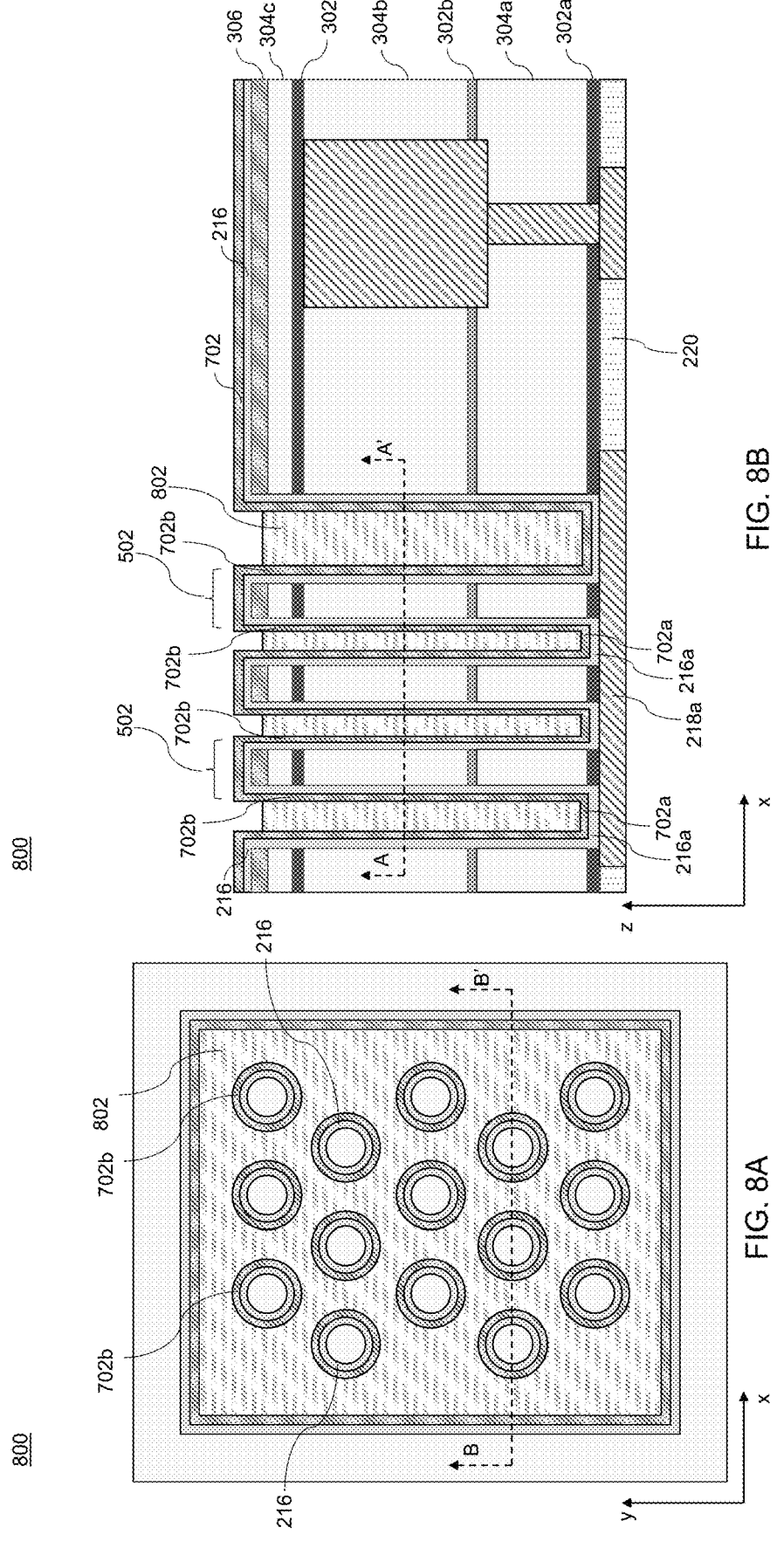
FIG. 8A is a horizontal cross-sectional view of a further intermediate structure that may be used in the formation of a high-density capacitor, according to various embodiments.
FIG. 8B is a vertical cross-sectional view of the intermediate structure of FIG. 8A, according to various embodiments.

FIG. 8A is a horizontal cross-sectional view of a further intermediate structure 800 that may be used in the formation of a high-density capacitor, and FIG. 8B is a vertical cross-sectional view of the intermediate structure 800 of FIG. 8A, according to various embodiments. The plane defining the horizontal cross-sectional view of FIG. 8A is indicated by the cross section A-A' in FIG. 8B and the plane defining the vertical cross-sectional view of FIG. 8B is indicated by the cross section B-B' in FIG. 8A. The intermediate structure 800 may be formed from the intermediate structure 700 of FIGS. 7A and 7B by forming a first protective layer 802 around the pillar structures 502. The first protective layer 802 may be a polymer material that may have anti-reflective properties for certain wavelengths of optical radiation. For example, the first protective layer 802 may be a photoresist sensitive to a narrow bandwidth of radiation (e.g., mercury i-line radiation). The first protective layer 802 may be formed by depositing the polymer material over the intermediate structure 700 of FIGS. 7A and 7B. The polymer material may then be etched to expose a top surface of the first electrically conducting layer 702 including top portions of the pillar structures 502.

Figures 9A, 9B:
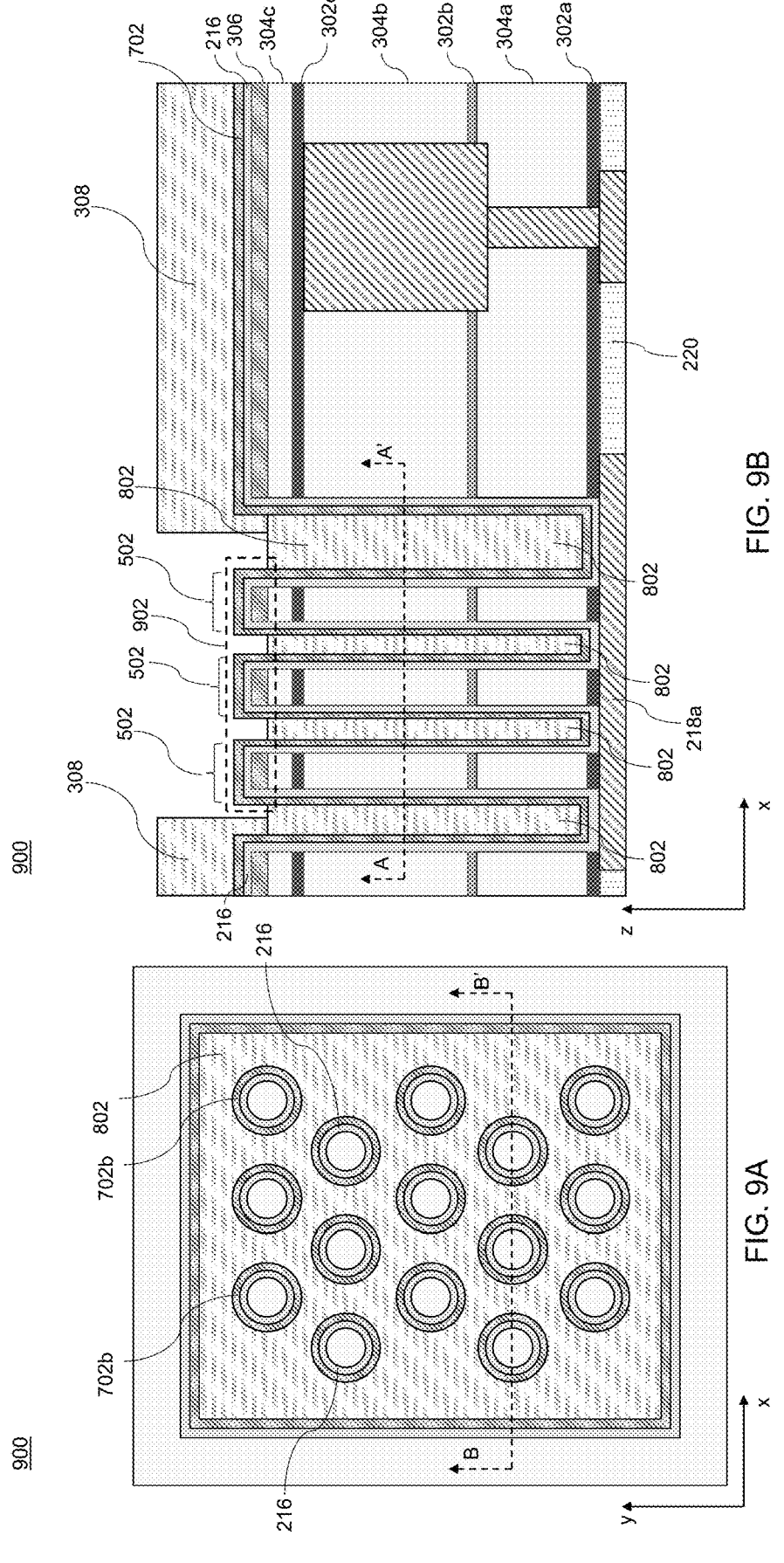
FIG. 9A is a horizontal cross-sectional view of a further intermediate structure that may be used in the formation of a high-density capacitor, according to various embodiments.
FIG. 9B is a vertical cross-sectional view of the intermediate structure of FIG. 9A, according to various embodiments.

FIG. 9A is a horizontal cross-sectional view of a further intermediate structure 900 that may be used in the formation of a high-density capacitor, and FIG. 9B is a vertical cross-sectional view of the intermediate structure 900 of FIG. 9A, according to various embodiments. The plane defining the horizontal cross-sectional view of FIG. 9A is indicated by the cross section A-A' in FIG. 9B and the plane defining the vertical cross-sectional view of FIG. 9B is indicated by the cross section B-B' in FIG. 9A. The intermediate structure 900 may be formed from the intermediate structure 800 of FIGS. 8A and 8B by forming a patterned photoresist 308 over the intermediate structure 800 of FIGS. 8A and 8B. As shown in FIG. 9B, the patterned photoresist 308 exposes top portions 902 of the pillar structures 502 while covering remaining portions of the intermediate structure 900. As such, the top portions 902 of the pillar structures 502 may be removed by performing an etching process as described in greater detail with reference to FIGS. 10A and 10B.

Figures 10A, 10B:
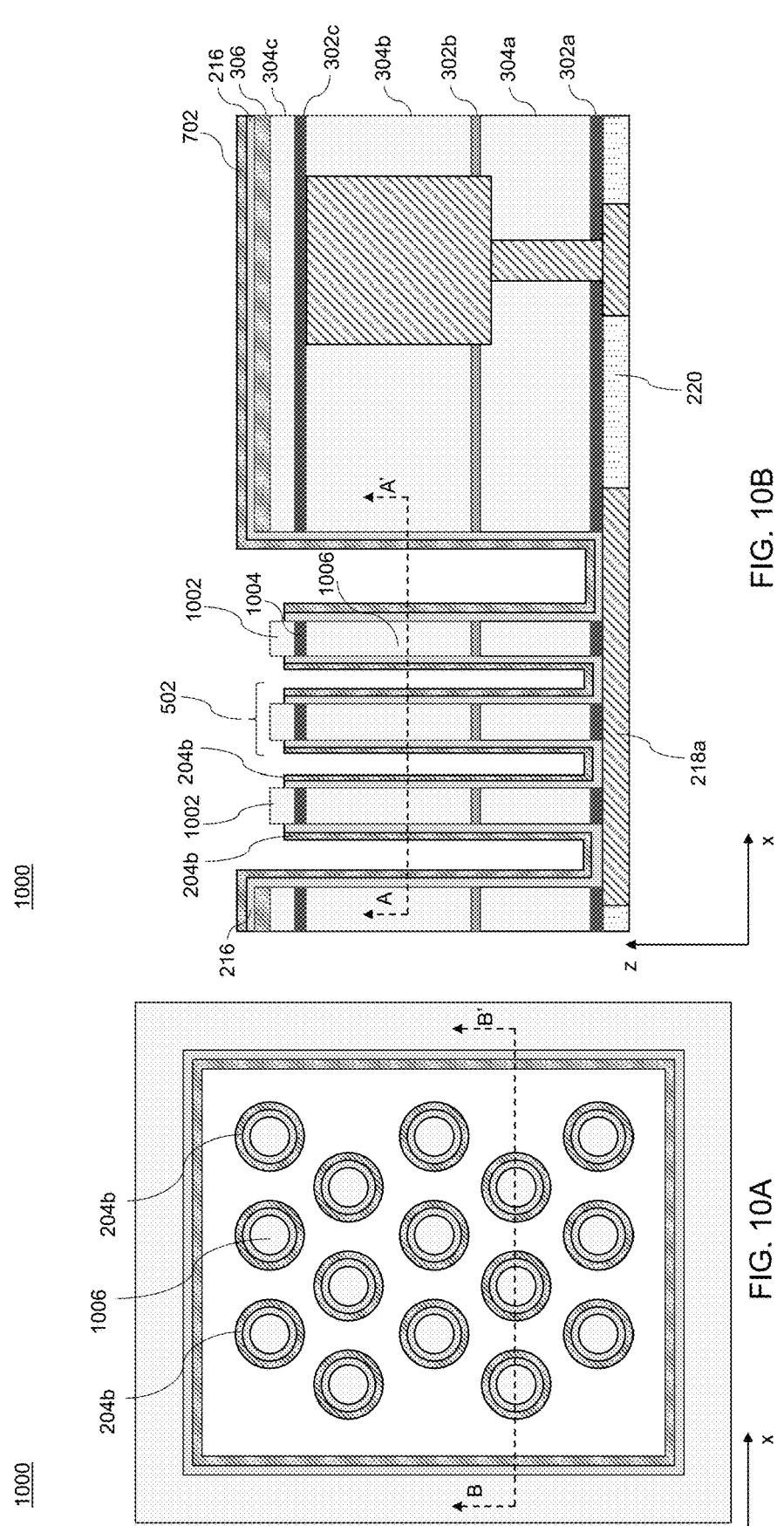
FIG. 10A is a horizontal cross-sectional view of a further intermediate structure that may be used in the formation of a high-density capacitor, according to various embodiments.
FIG. 10B is a vertical cross-sectional view of the intermediate structure of FIG. 10A, according to various embodiments.

FIG. 10A is a horizontal cross-sectional view of a further intermediate structure 1000 that may be used in the formation of a high-density capacitor, and FIG. 10B is a vertical cross-sectional view of the intermediate structure 1000 of FIG. 10A, according to various embodiments. The plane defining the horizontal cross-sectional view of FIG. 10A is indicated by the cross section A-A' in FIG. 10B and the plane defining the vertical cross-sectional view of FIG. 10B is indicated by the cross section B-B' in FIG. 10A. The intermediate structure 1000 may be formed from the intermediate structure 900 of FIGS. 9A and 9B by performing an etching operation to remove the top portions 902 (e.g., see FIG. 9B) of the pillar structures 502 followed by removing the patterned photoresist 308 and the first protective layer 802.

In this regard, an anisotropic etch process may be performed to remove top portions of the first electrically conducting layer 702, top portions of the barrier layer 216, and portions of the patterned hard mask 306. As shown in FIG. 10B, the etching process may expose top cylindrical portions 1002 of the pillar structures 502. At the completion of the etching process, the patterned photoresist 308 and the first protective layer 802 may be removed (e.g., by ashing or by dissolution with a solvent). As shown in FIG. 10B, for example, removal of the top portions 902 of the pillar structures 502 converts the cylindrical portions 702b of the first electrically conducting layer 702 into respective outer shells 204b of the cylindrical portions 202 of the bottom electrode (204a, 204b) described above with reference to FIGS. 2A and 2B. In additional processing operations, the top cylindrical portions 1002 of the pillar structures 502, as well as cylindrical portions 1004 of the third boundary layer 302c and cylindrical portions 1006 of the second dielectric layer 304b may be selectively etched, as described in greater detail with reference to FIGS. 11A and 11B, below.

Figures 11A, 11B:
FIG. 11A is a horizontal cross-sectional view of a further intermediate structure that may be used in the formation of a high-density capacitor, according to various embodiments.
FIG. 11B is a vertical cross-sectional view of the intermediate structure of FIG. 11A, according to various embodiments.

FIG. 11A is a horizontal cross-sectional view of a further intermediate structure 1100 that may be used in the formation of a high-density capacitor, and FIG. 11B is a vertical cross-sectional view of the intermediate structure 1100 of FIG. 11A, according to various embodiments. The plane defining the horizontal cross-sectional view of FIG. 11A is indicated by the cross section A-A' in FIG. 11B and the plane defining the vertical cross-sectional view of FIG. 11B is indicated by the cross section B-B' in FIG. 11A. The intermediate structure 1100 may be formed from the intermediate structure 1000 of FIGS. 10A and 10B by performing the above-mentioned selective etching process to etch cylindrical portions of the pillar structures 502 including the top cylindrical portions 1002, cylindrical portions 1004 of the third boundary layer 302c, and cylindrical portions 1006 of the second dielectric layer 304b (e.g., see FIGS. 10A and 10B). As such, the etching process may generate a plurality of cylindrical cavities 1102 in the pillar structures 502, as shown in FIG. 11B.

In some embodiments, a wet chemical selective etch or a vapor etch may be performed to etch the cylindrical portions (1002, 1004, 1006) of the pillar structures 502. In this regard, in some embodiments a liquid or vapor including hydrofluoric (HF) acid may be introduced that may etch top cylindrical portions 1002, cylindrical portions 1004 of the third boundary layer 302c, and cylindrical portions 1006 of the second dielectric layer 304b.

Figures 12A, 12B:
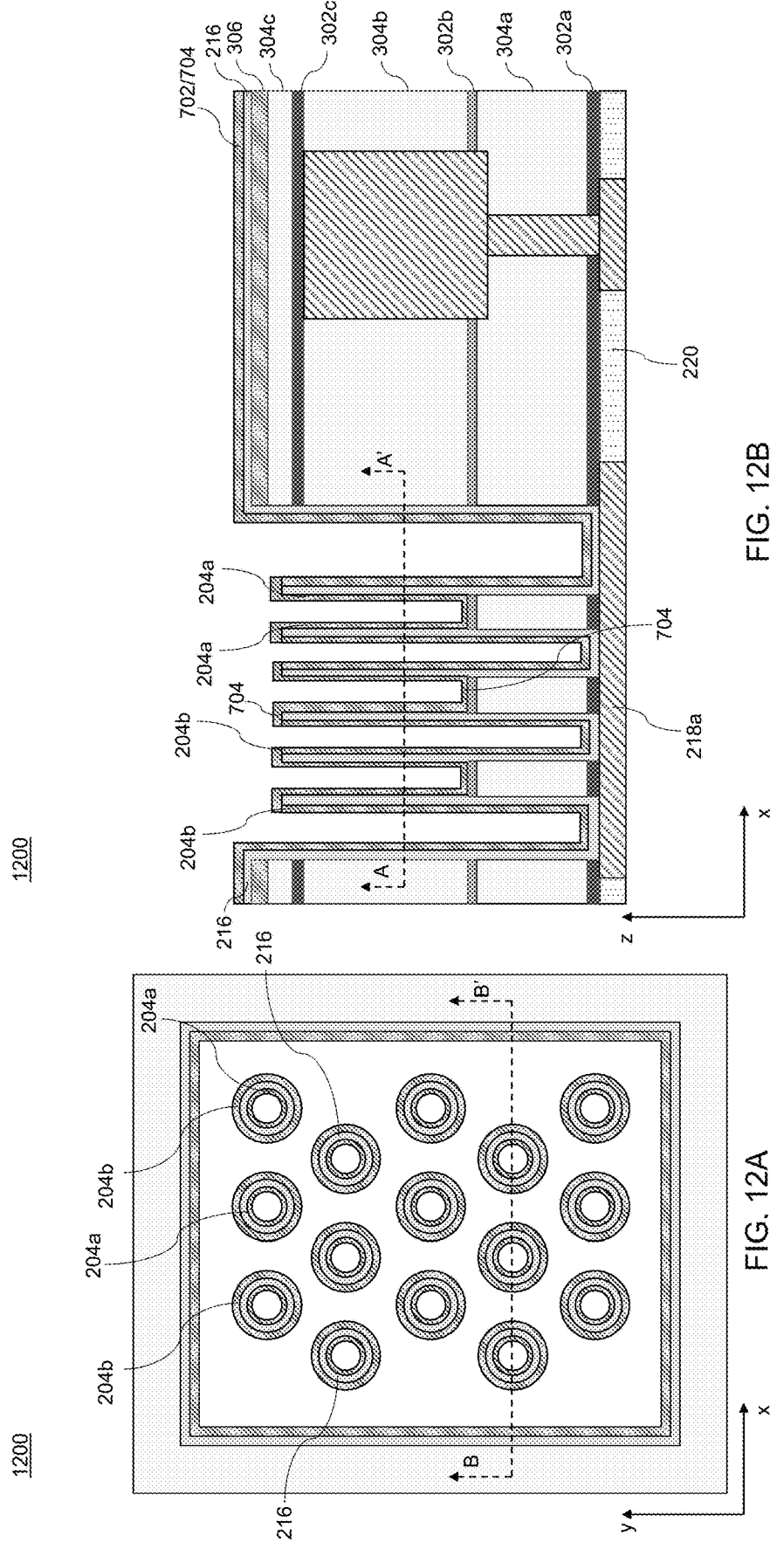
FIG. 12A is a horizontal cross-sectional view of a further intermediate structure that may be used in the formation of a high-density capacitor, according to various embodiments.
FIG. 12B is a vertical cross-sectional view of the intermediate structure of FIG. 12A, according to various embodiments.

FIG. 12A is a horizontal cross-sectional view of a further intermediate structure 1200 that may be used in the formation of a high-density capacitor, and FIG. 12B is a vertical cross-sectional view of the intermediate structure 1200 of FIG. 12A, according to various embodiments. The plane defining the horizontal cross-sectional view of FIG. 12A is indicated by the cross section A-A' in FIG. 12B and the plane defining the vertical cross-sectional view of FIG. 12B is indicated by the cross section B-B' in FIG. 12A. The intermediate structure 1200 may be formed from the intermediate structure 1100 of FIGS. 11A and 11B by depositing a second electrically conducting layer 704 over the intermediate structure 1100. The second electrically conducting layer 704 may include a conductive metallic nitride or a conductive metallic carbide such as TiN, TaN, WN, TiC, TaC, and/or WC. Other suitable conductive materials within the contemplated scope of this disclosure may also be used.

The second electrically conducting layer 704 may be deposited so as to form an electrically conductive contact with the barrier layer 216 within the interior cylindrical sidewalls of cylindrical cavities 1102 in the pillar structures 502 and to make electrically conductive contact with the outer shells 204b. The portions of the second electrically conducting layer 704 formed along the cylindrical sidewalls of cylindrical cavities 1102 thereby form the inner shells 204a of the bottom electrode (204a, 204b) described above with reference to FIGS. 2A and 2B.

Figures 13A, 13B:
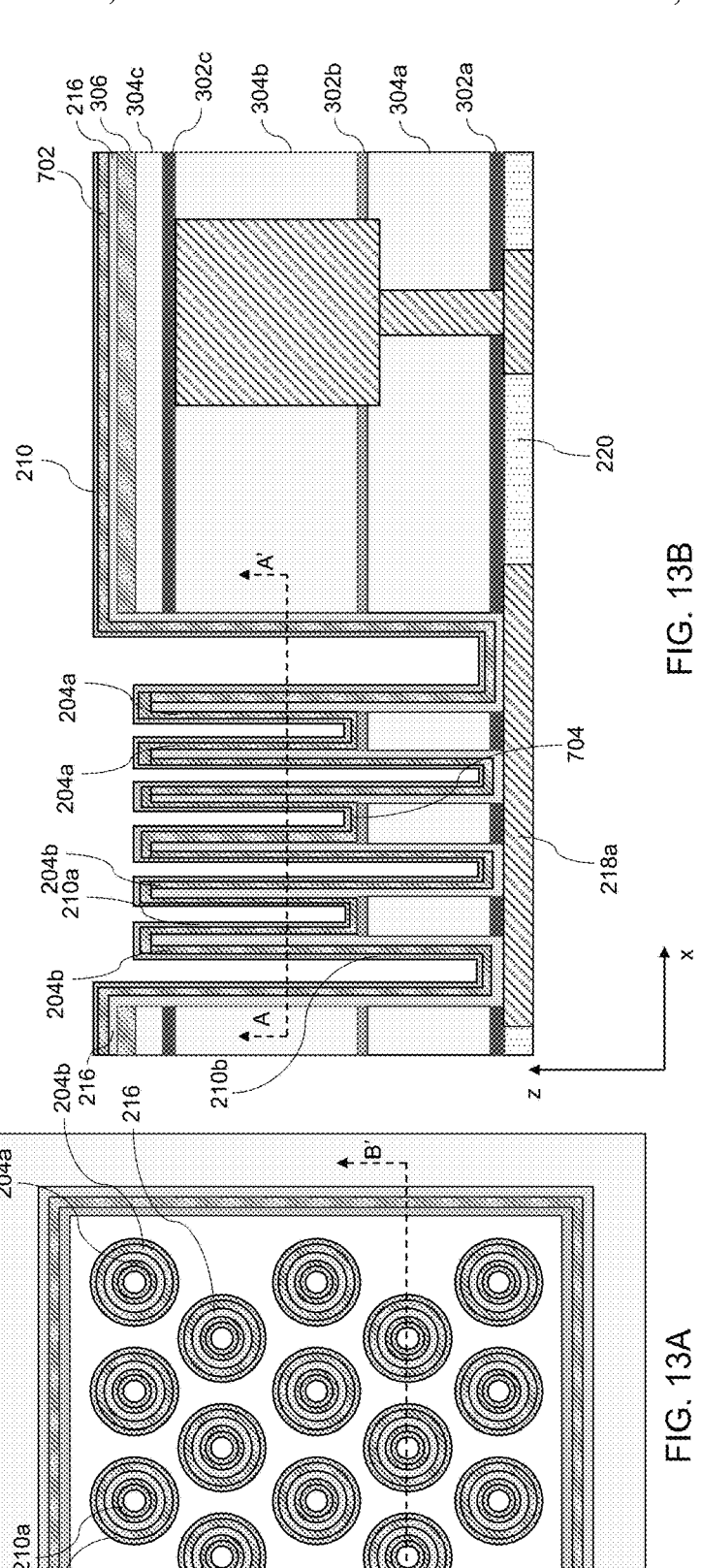
FIG. 13A is a horizontal cross-sectional view of a further intermediate structure that may be used in the formation of a high-density capacitor, according to various embodiments.
FIG. 13B is a vertical cross-sectional view of the intermediate structure of FIG. 13A, according to various embodiments.

FIG. 13A is a horizontal cross-sectional view of a further intermediate structure 1300 that may be used in the formation of a high-density capacitor, and FIG. 13B is a vertical cross-sectional view of the intermediate structure 1300 of FIG. 13A, according to various embodiments. The plane defining the horizontal cross-sectional view of FIG. 13A is indicated by the cross section A-A' in FIG. 13B and the plane defining the vertical cross-sectional view of FIG. 13B is indicated by the cross section B-B' in FIG. 13A. The intermediate structure 1300 may be formed from the intermediate structure 1200 of FIGS. 12A and 12B by forming a dielectric layer 210 over the intermediate structure 1200. As shown in FIGS. 13A and 13B portions of the dielectric layer 210 formed over internal cylindrical walls over the inner shells 204a may form the first concentric portion 210a of the dielectric layer, as described above with reference to FIGS. 2A and 2B. Similarly, portions of the dielectric layer 210 formed over external cylindrical walls over the outer shells 204b may form the second concentric portion 210b of the dielectric layer described above with reference to FIGS. 2A and 2B.

In various embodiments, the dielectric layer (210, 210a, 210b) may be a high-k dielectric material. Examples of high-k dielectric materials include, but are not limited to, hafnium oxide, hafnium silicon oxide, hafnium tantalum oxide, hafnium titanium oxide, hafnium zirconium oxide, zirconium oxide, titanium oxide, aluminum oxide, and hafnium dioxide-alumina. Other suitable dielectric materials are within the contemplated scope of disclosure. In various embodiments, the dielectric layer (210, 210a, 210b) may have a thickness in the range of 0.5-5.0 nm, such as 1-4 nm, although greater or lesser thicknesses may be used.

Figures 14A, 14B:
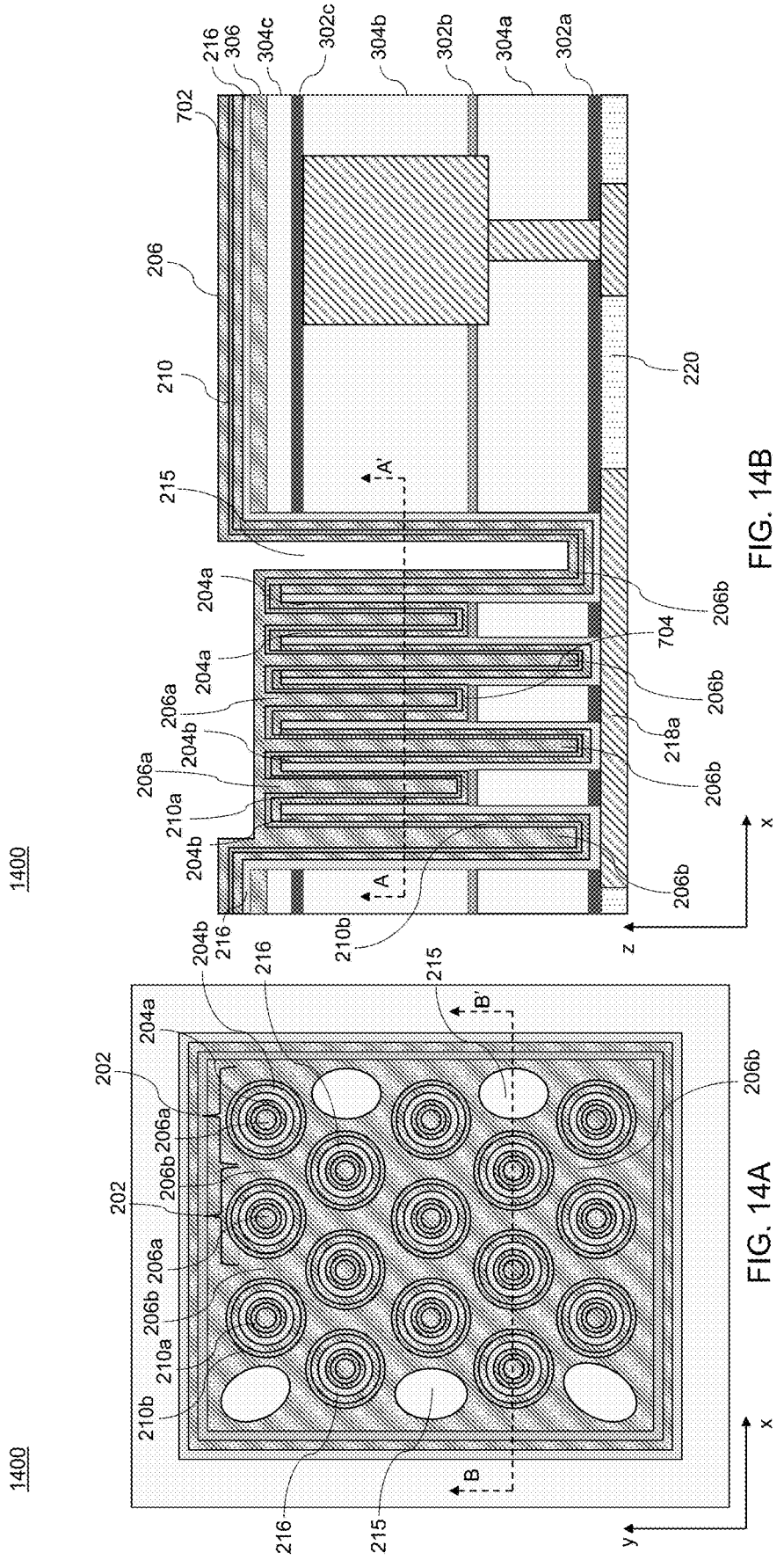
FIG. 14A is a horizontal cross-sectional view of a further intermediate structure that may be used in the formation of a high-density capacitor, according to various embodiments.
FIG. 14B is a vertical cross-sectional view of the intermediate structure of FIG. 14A, according to various embodiments.

FIG. 14A is a horizontal cross-sectional view of a further intermediate structure 1400 that may be used in the formation of a high-density capacitor, and FIG. 14B is a vertical cross-sectional view of the intermediate structure 1400 of FIG. 14A, according to various embodiments. The plane defining the horizontal cross-sectional view of FIG. 14A is indicated by the cross section A-A' in FIG. 14B and the plane defining the vertical cross-sectional view of FIG. 14B is indicated by the cross section B-B' in FIG. 14A. The intermediate structure 1400 may be formed from the intermediate structure 1300 of FIGS. 13A and 13B by depositing a third electrically conducting layer 206 over the intermediate structure 1300. The third electrically conducting layer 206 may include a conductive metallic nitride or a conductive metallic carbide such as TiN, TaN, WN, TiC, TaC, and/or WC. Other suitable conductive materials within the contemplated scope of this disclosure may also be used.

As shown in FIGS. 14A and 14B, portions of the third electrically conducting layer 206 may form portions of the top electrode (206a, 206b). In this regard, portions of the third electrically conducting layer 206 may include a plurality of vertical portions 206a and a surrounding portion 206b, as described above with reference to FIGS. 2A and 2B. Further, as described above with reference to FIGS. 2A and 2B, in certain embodiments, one or more dielectric spacer regions 215 may be formed when a plurality of non-concentric cylindrical portions 202 having spatial distribution having a first symmetry (e.g., hexagonal) is placed in a region having a second symmetry (e.g., rectangular). In this regard, the dielectric spacer regions 215 may be spaces that are too large to be completely filled by the third electrically conducting layer 206.

Figures 15A, 15B:
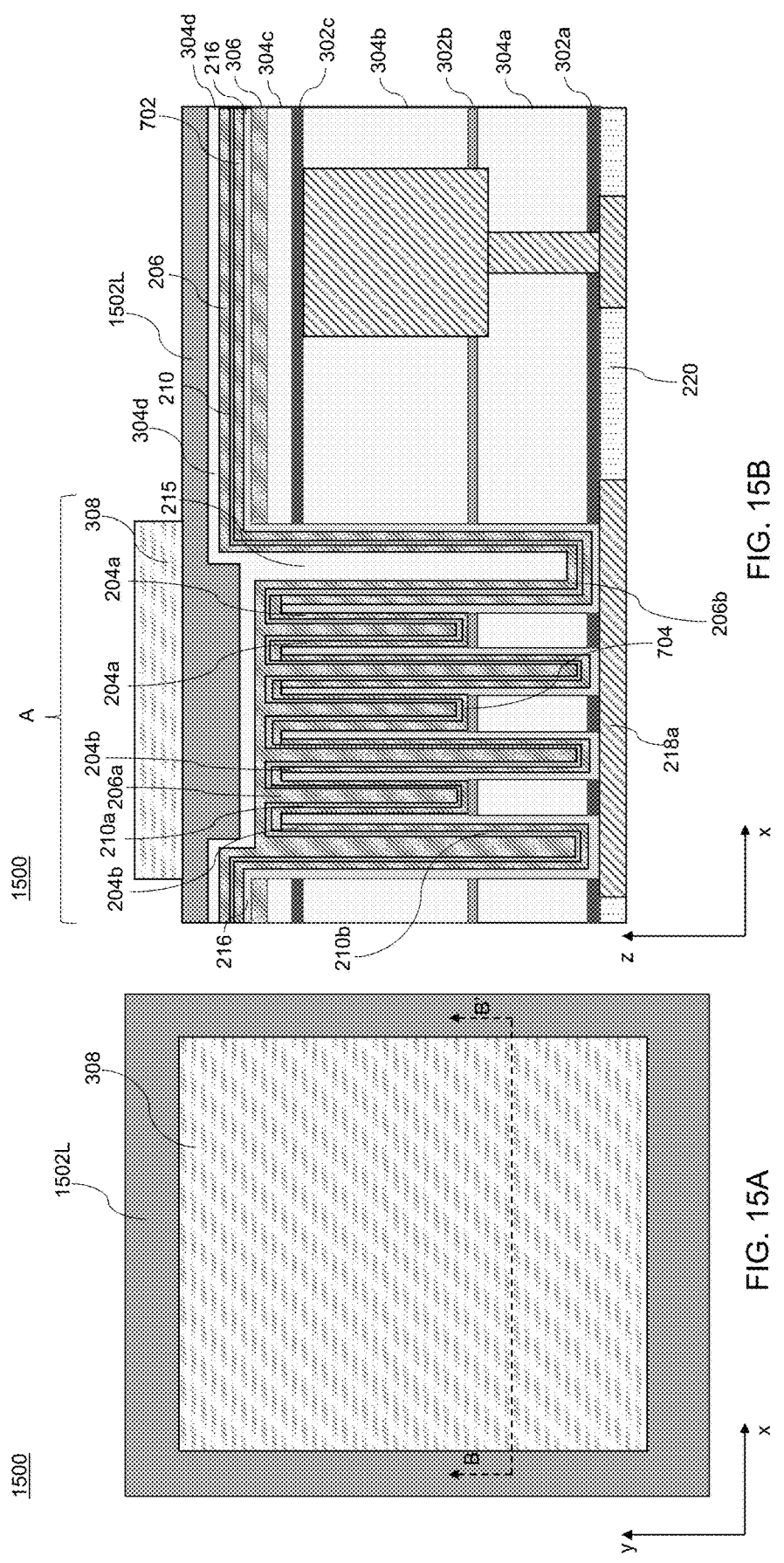
FIG. 15A is a top view of a further intermediate structure that may be used in the formation of a high-density capacitor, according to various embodiments.
FIG. 15B is a vertical cross-sectional view of the intermediate structure of FIG. 15A, according to various embodiments.

FIG. 15A is a top view of a further intermediate structure 1500 that may be used in the formation of a high-density capacitor (200, 2200), and FIG. 15B is a vertical cross-sectional view of the intermediate structure 1500 of FIG. 15A, according to various embodiments. The plane defining the vertical cross-sectional view of FIG. 15B is indicated by the cross section B-B' in FIG. 15A and the region of the intermediate structure 1500 shown in the top view of FIG. 15A is indicated by the brace labeled "A" in FIG. 15B. The intermediate structure 1500 may be formed from the intermediate structure 1400 of FIGS. 14A and 14B by forming a fourth dielectric layer 304d and a second protective layer 1502L over the intermediate structure 1400. A patterned photoresist 308 may then be formed over the second protective layer 1502L.

The fourth dielectric layer 304d may include, for example, undoped silicate glass, a doped silicate glass (e.g., deposited by decomposition of TEOS), organosilicate glass, silicon oxynitride, or silicon carbide nitride. Other dielectric materials are within the contemplated scope of disclosure. The dielectric material of the fourth dielectric layer 304d may be deposited by a conformal deposition process (such as a chemical vapor deposition process) or a self-planarizing deposition process (such as spin coating). The second protective layer 1502L may include an etch stop material such as silicon nitride, silicon carbide, silicon nitride carbide, or a dielectric metal oxide (such as aluminum oxide, titanium oxide, tantalum oxide, etc.). In an example embodiment, the second protective layer 1502L may include silicon nitride. The second protective layer 1502L may be deposited by a conformal or non-conformal deposition process. In one embodiment, the second protective layer 1502L may be deposited by chemical vapor deposition, atomic layer deposition, or physical vapor deposition.

Figures 16A, 16B:
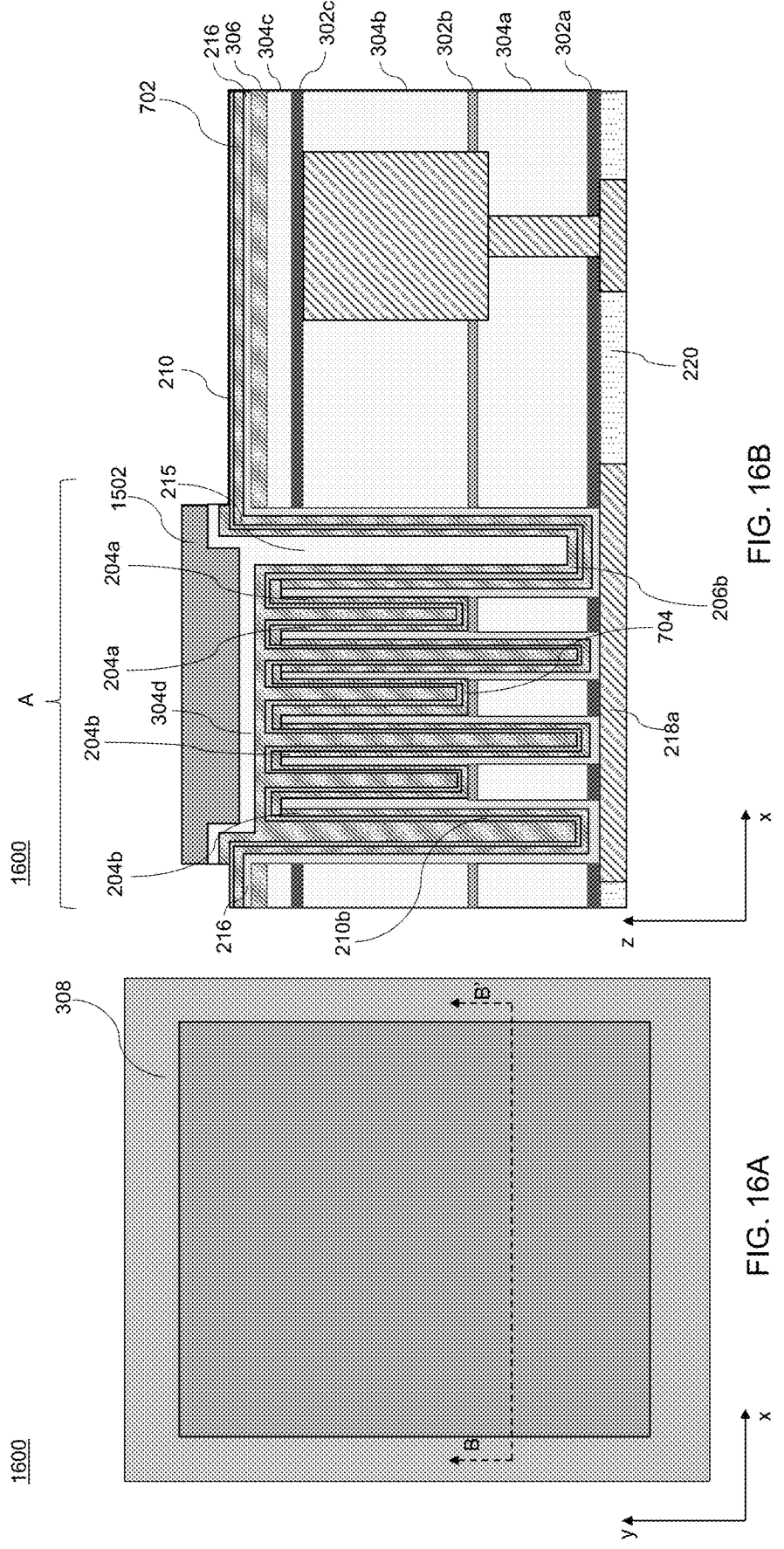
FIG. 16A is a top view of a further intermediate structure that may be used in the formation of a high-density capacitor, according to various embodiments.
FIG. 16B is a vertical cross-sectional view of the intermediate structure of FIG. 16A, according to various embodiments.

FIG. 16A is a top view of a further intermediate structure 1600 that may be used in the formation of a high-density capacitor (200, 2200), and FIG. 16B is a vertical cross-sectional view of the intermediate structure 1600 of FIG. 16A, according to various embodiments. The plane defining the vertical cross-sectional view of FIG. 16B is indicated by the cross section B-B' in FIG. 16A and the region of the intermediate structure 1600 shown in the top view of FIG. 16A is indicated by the brace labeled "A" in FIG. 16B. The intermediate structure 1600 may be formed from the intermediate structure 1500 of FIGS. 15A and 15B by performing an anisotropic etch process to etch portions of the second protective layer 1502L, the fourth dielectric layer 304d, and portions of the third electrically conducting layer 206 that are not masked by the patterned photoresist 308. The patterned photoresist 308 may then be removed by ashing or by dissolution with a solvent. The remaining portion of the second protective layer 1502L may thus form a patterned second protective layer 1502 that may act as a hard mask that may be used during further processing operations, as described in greater detail with reference to FIGS. 17A and 17B.

Figures 17A, 17B:
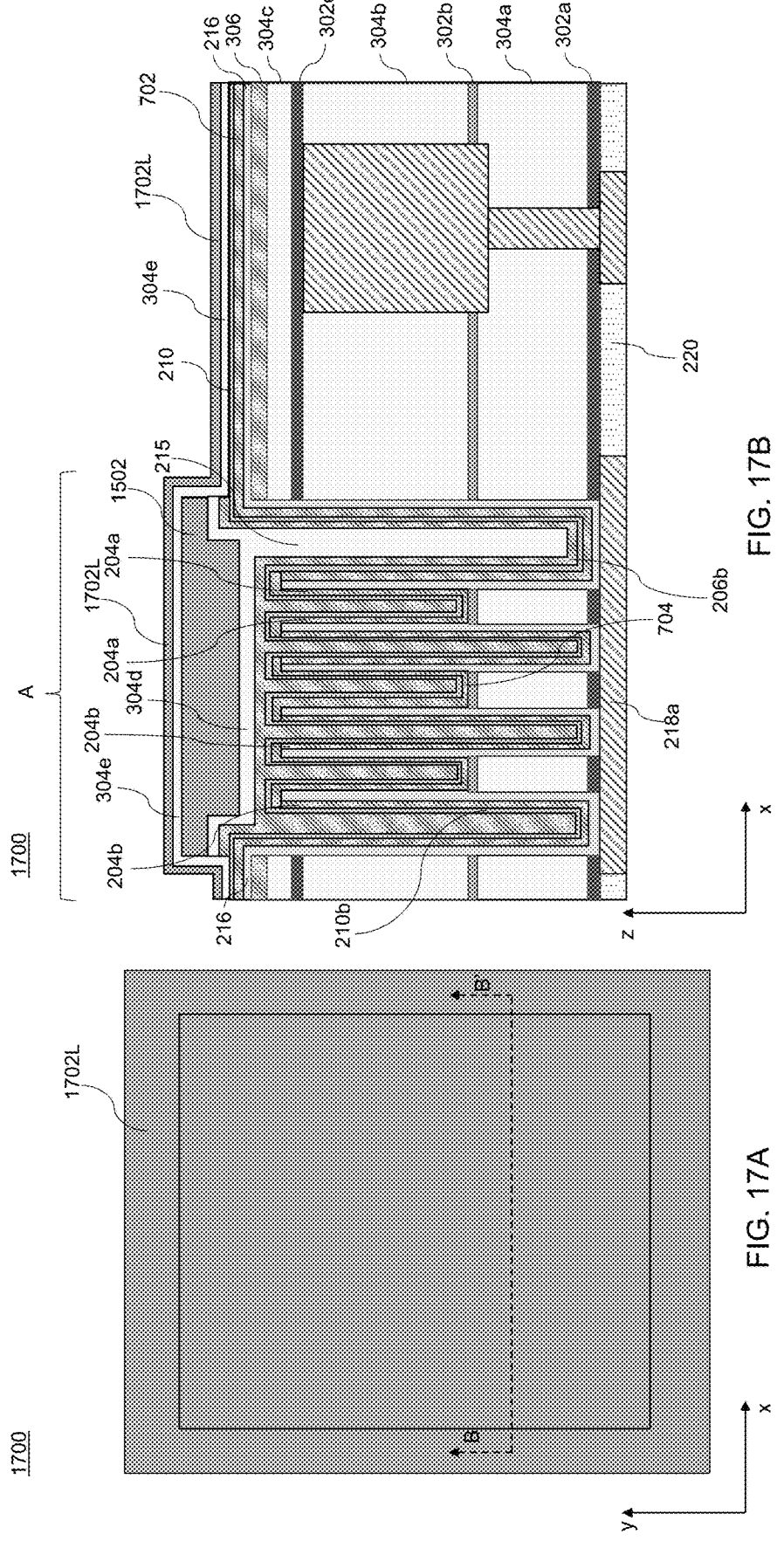
FIG. 17A is a top view of a further intermediate structure that may be used in the formation of a high-density capacitor, according to various embodiments.
FIG. 17B is a vertical cross-sectional view of the intermediate structure of FIG. 17A, according to various embodiments.

FIG. 17A is a top view of a further intermediate structure 1700 that may be used in the formation of a high-density capacitor (200, 2200), and FIG. 17B is a vertical cross-sectional view of the intermediate structure 1700 of FIG. 17A, according to various embodiments. The plane defining the vertical cross-sectional view of FIG. 17B is indicated by the cross section B-B' in FIG. 17A and the region of the intermediate structure 1700 shown in the top view of FIG. 17A is indicated by the brace labeled "A" in FIG. 17B. The intermediate structure 1700 may be formed from the intermediate structure 1600 of FIGS. 16A and 16B by forming a fifth dielectric layer 304e and a third protective layer 1702L over the intermediate structure 1600.

Figures 18A, 18B:
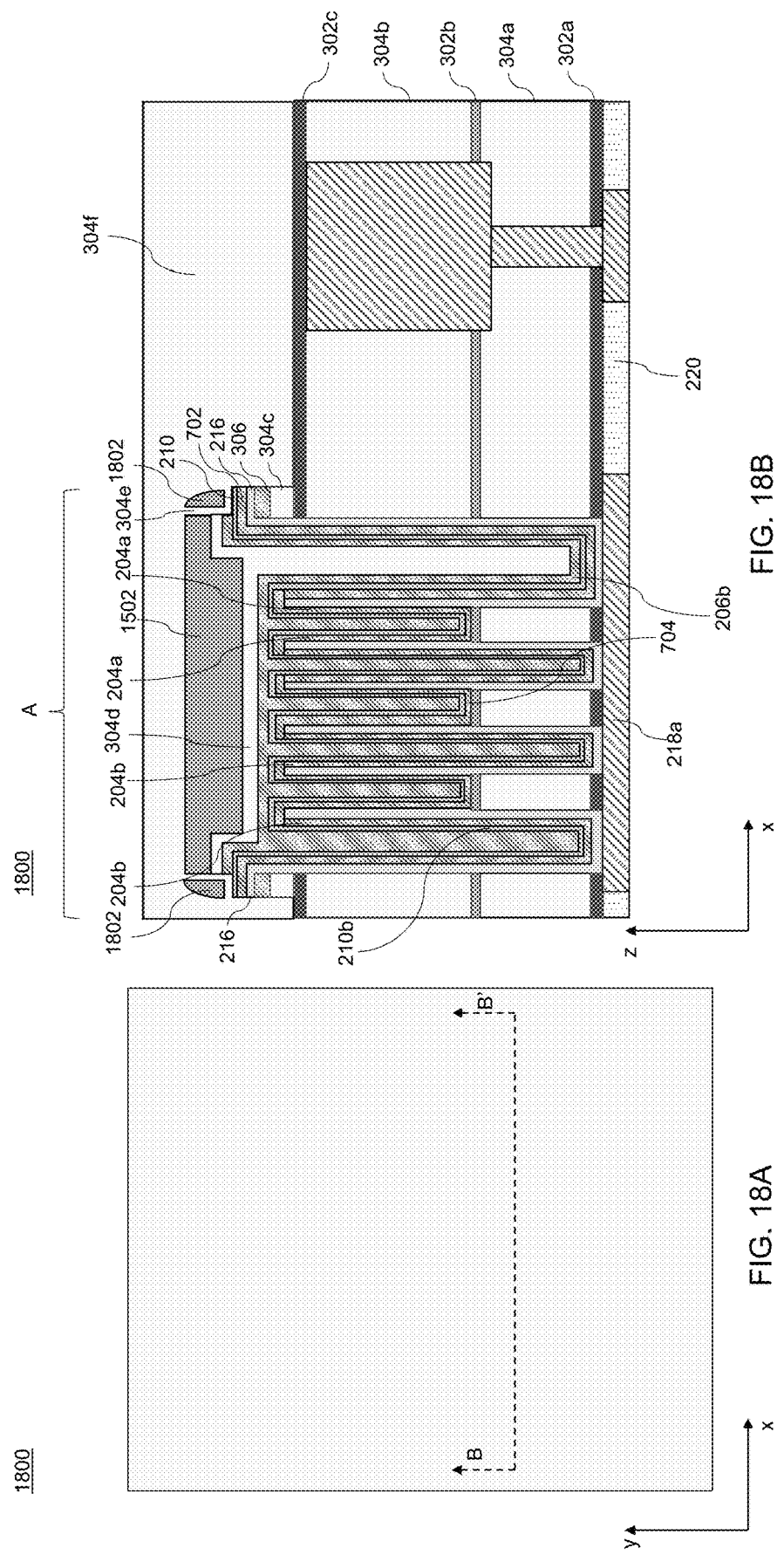
FIG. 18A is a top view of a further intermediate structure that may be used in the formation of a high-density capacitor, according to various embodiments.
FIG. 18B is a vertical cross-sectional view of the intermediate structure of FIG. 18A, according to various embodiments.

FIG. 18A is a top view of a further intermediate structure 1800 that may be used in the formation of a high-density capacitor (200, 2200), and FIG. 18B is a vertical cross-sectional view of the intermediate structure 1800 of FIG. 18A, according to various embodiments. The plane defining the vertical cross-sectional view of FIG. 18B is indicated by the cross section B-B' in FIG. 18A and the region of the intermediate structure 1800 shown in the top view of FIG. 18A is indicated by the brace labeled "A" in FIG. 18B. The intermediate structure 1800 may be formed from the intermediate structure 1700 of FIGS. 17A and 17B by performing an anisotropic etch process to regions of the intermediate structure 1700 that are not masked by the patterned second protective layer 1502 including portions of the third protective layer 1702L, the fifth dielectric layer 304e, the dielectric layer 210, the first electrically conducting layer 702, the barrier layer 216, the patterned hard mask 306, and the third dielectric layer 304c, as shown in FIG. 18B. A sixth dielectric layer 304f may then be formed over the resulting structure. The sixth dielectric layer 304f may then be planarized using a planarizing process (e.g., chemical mechanical planarization). As shown in FIG. 18B, a protective spacer 1802 may be formed from the third protective layer 1702L during the etching process.

Figures 19A, 19B:
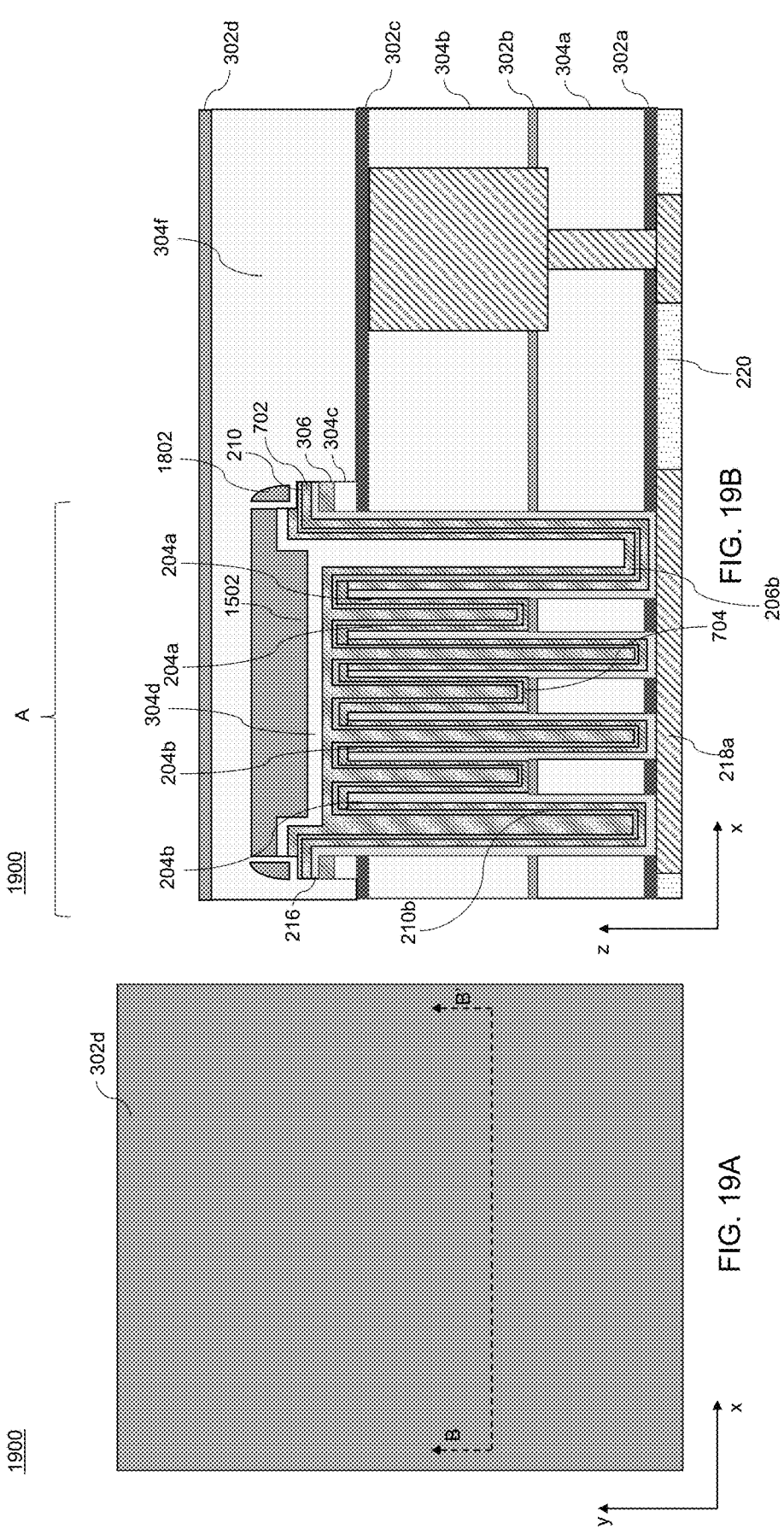
FIG. 19A is a top view of a further intermediate structure that may be used in the formation of a high-density capacitor, according to various embodiments.
FIG. 19B is a vertical cross-sectional view of the intermediate structure of FIG. 19A, according to various embodiments.

FIG. 19A is a top view of a further intermediate structure 1900 that may be used in the formation of a high-density capacitor (200, 2200), and FIG. 19B is a vertical cross-sectional view of the intermediate structure 1900 of FIG. 19A, according to various embodiments. The plane defining the vertical cross-sectional view of FIG. 19B is indicated by the cross section B-B' in FIG. 19A and the region of the intermediate structure 1900 shown in the top view of FIG. 19A is indicated by the brace labeled "A" in FIG. 19B. The intermediate structure 1900 may be formed from the intermediate structure 1800 of FIGS. 18A and 18B by forming a fourth boundary layer 302d over the intermediate structure 1800. The fourth boundary layer 302d may include an etch stop material such as silicon nitride, silicon carbide, silicon nitride carbide, or a dielectric metal oxide (such as aluminum oxide, titanium oxide, tantalum oxide, etc.). In an example embodiment, the fourth boundary layer 302d may include silicon nitride. The fourth boundary layer 302d may be deposited by a conformal or non-conformal deposition process. In one embodiment, the fourth boundary layer 302d may be deposited by chemical vapor deposition, atomic layer deposition, or physical vapor deposition. The thickness of the fourth boundary layer 302d may be in a range from approximately 2 nm to approximately 20 nm, such as from approximately 3 nm to approximately 12 nm, although smaller and larger thicknesses may also be used.

Figures 20A, 20B:
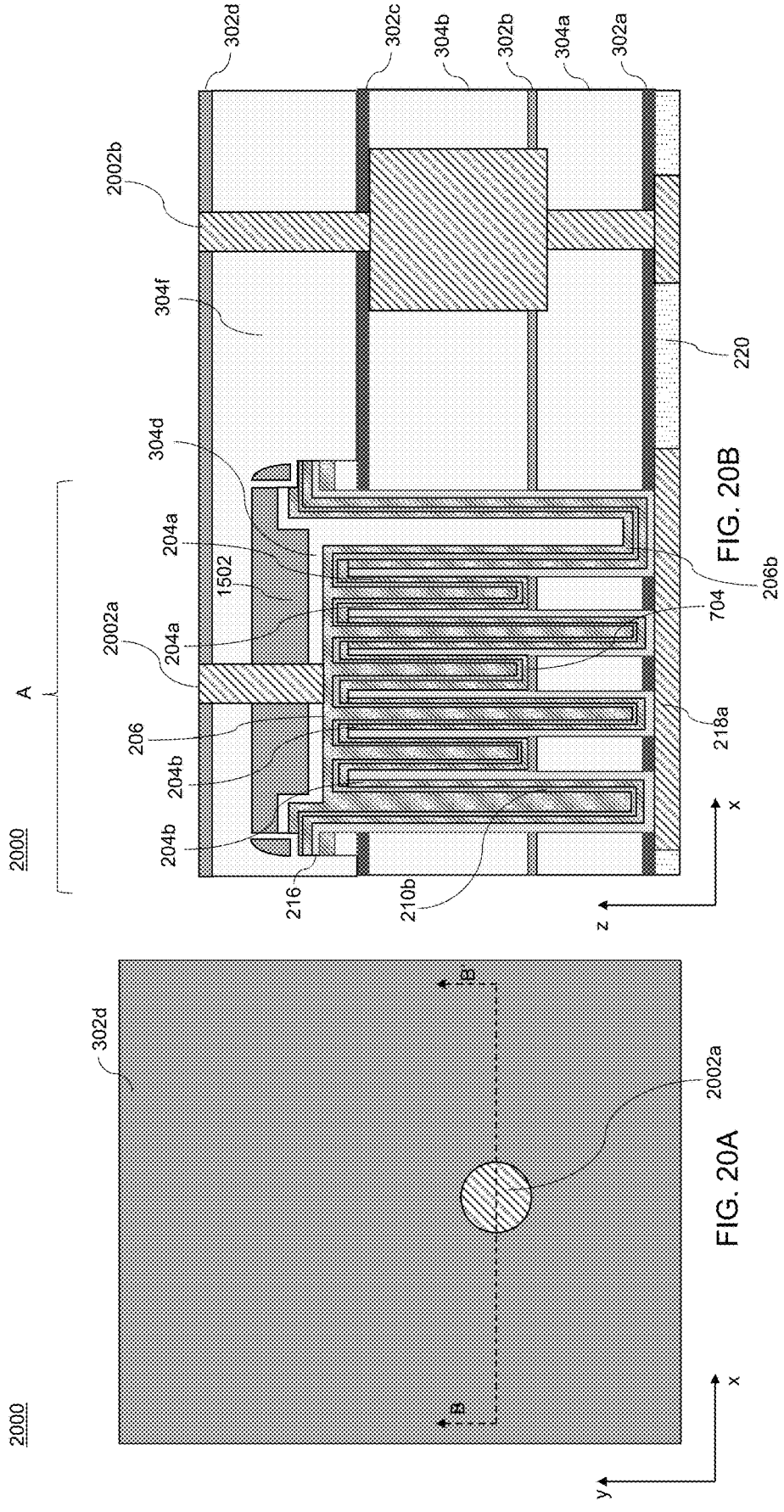
FIG. 20A is a top view of a further intermediate structure that may be used in the formation of a high-density capacitor, according to various embodiments.
FIG. 20B is a vertical cross-sectional view of the intermediate structure of FIG. 20A, according to various embodiments.

FIG. 20A is a top view of a further intermediate structure 2000 that may be used in the formation of a high-density capacitor (200, 2200), and FIG. 20B is a vertical cross-sectional view of the intermediate structure 2000 of FIG. 20A, according to various embodiments. The plane defining the vertical cross-sectional view of FIG. 20B is indicated by the cross section B-B' in FIG. 20A and the region of the intermediate structure 2000 shown in the top view of FIG. 20A is indicated by the brace labeled "A" in FIG. 20B. The intermediate structure 2000 may be formed from the intermediate structure 1900 of FIGS. 19A and 19B by forming one or more electrically conducting via structures (2002a, 2002b) in the intermediate structure 1900.

In this regard, a patterned photoresist (not shown) may be formed over the fourth boundary layer 302d. The patterned photoresist may be used as a mask while etch the intermediate structure 1900. For example, unmasked portions of the patterned photoresist may correspond to locations in which via cavities may be etched. In this regard, an anisotropic etch process may be performed to etch via cavities through the fourth boundary layer 302d, the sixth dielectric layer 304f, the second protective layer 1502L, and the fourth dielectric layer 304d such that the via cavity is etched down to an electrically conducting surface of the third electrically conducting layer 206, which forms a top portion of the top electrode (206a, 206b). An electrically conductive material may then be deposited in the via cavities to form the electrically conducting vias (2002a, 2002b). As such, an electrically conducting via 2002a may be electrically connected to the top electrode (206a, 206b). In further processing operations, the electrically conducting via 2002a may be further electrically connected with additional electrical interconnect structures to be subsequently formed.

Figures 21A, 21B:
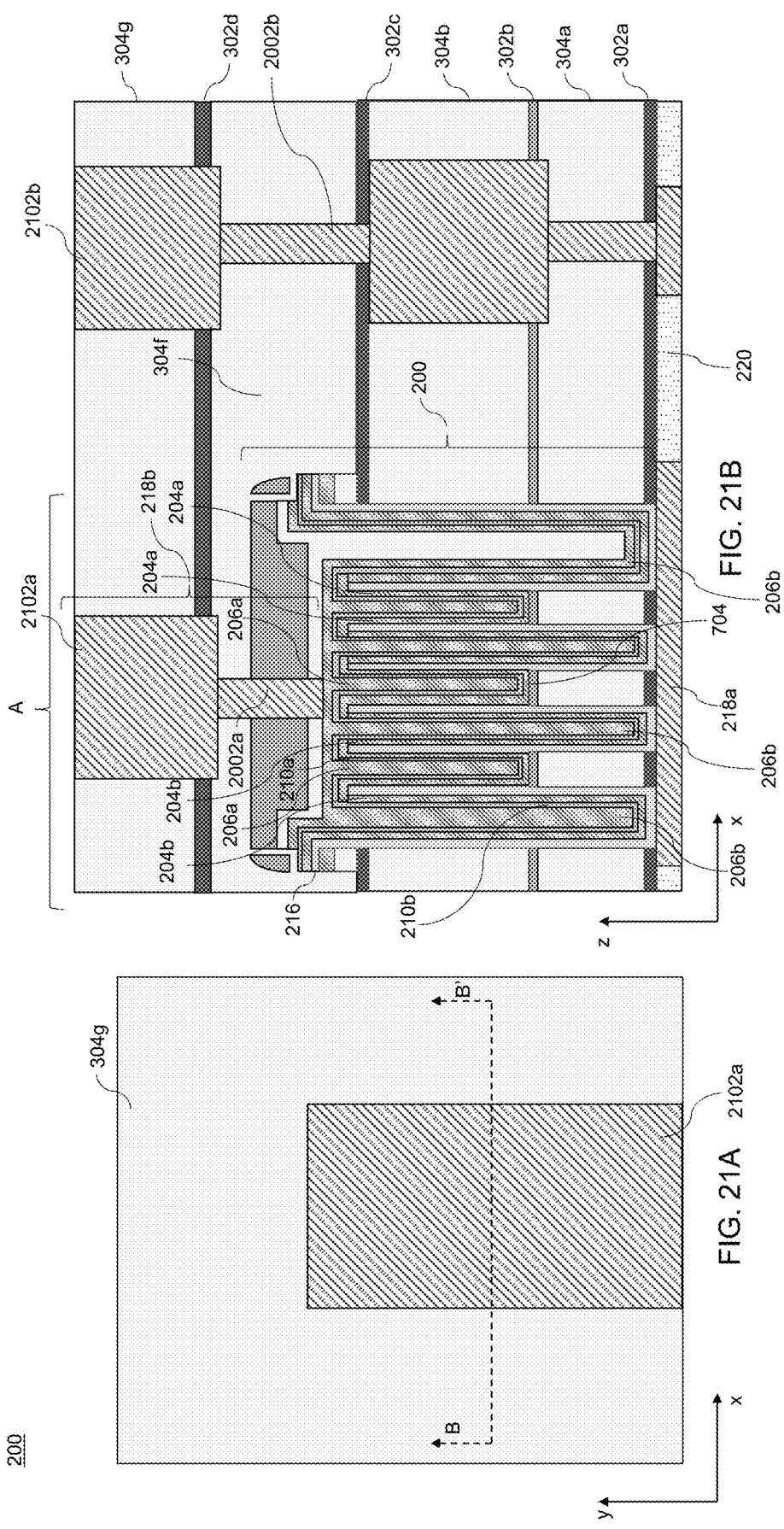
FIG. 21A is a top view of the high-density capacitor of FIGS. 2A and 2B, according to various embodiments.
FIG. 21B is a vertical cross-sectional view of the high-density capacitor of FIGS. 2A, 2B, and 21A, according to various embodiments.

FIG. 21A is a top view of the high-density capacitor 200 of FIGS. 2A and 2B, and FIG. 21B is a vertical cross-sectional view of the high-density capacitor 200 of FIGS. 2A, 2B, and 21A, according to various embodiments. The plane defining the vertical cross-sectional view of FIG. 21B is indicated by the cross section B-B' in FIG. 21A and the region of the high-density capacitor 200 shown in the top view of FIG. 21A is indicated by the brace labeled "A" in FIG. 21B. The high-density capacitor 200 may be formed from the intermediate structure 2000 of FIGS. 20A and 20B by forming a seventh dielectric layer 304g over the fourth boundary layer 302d and forming electrically conducting lines (2102a, 2102b) within the seventh dielectric layer 304g and fourth boundary layer 302d. As shown, the electrically conducting lines (2102a, 2102b) may be electrically connected to the electrically conducting vias (2002a, 2002b) to thereby form electrical interconnect structure. In this regard, the second interconnect structure 218b, described above with reference to FIGS. 2A and 2B, may include the leftmost electrically conducting via 2002a that is connected to the leftmost electrically conducting line 2102a. Thus, as described above with reference to FIGS. 2A and 2B, the high-density capacitor 200 may be disposed over an interlayer dielectric layer 220 that includes an interconnect structure 218a and may also be electrically connected to a second interconnect structure 218b formed above the high-density capacitor 200.

Figures 22A, 22B:
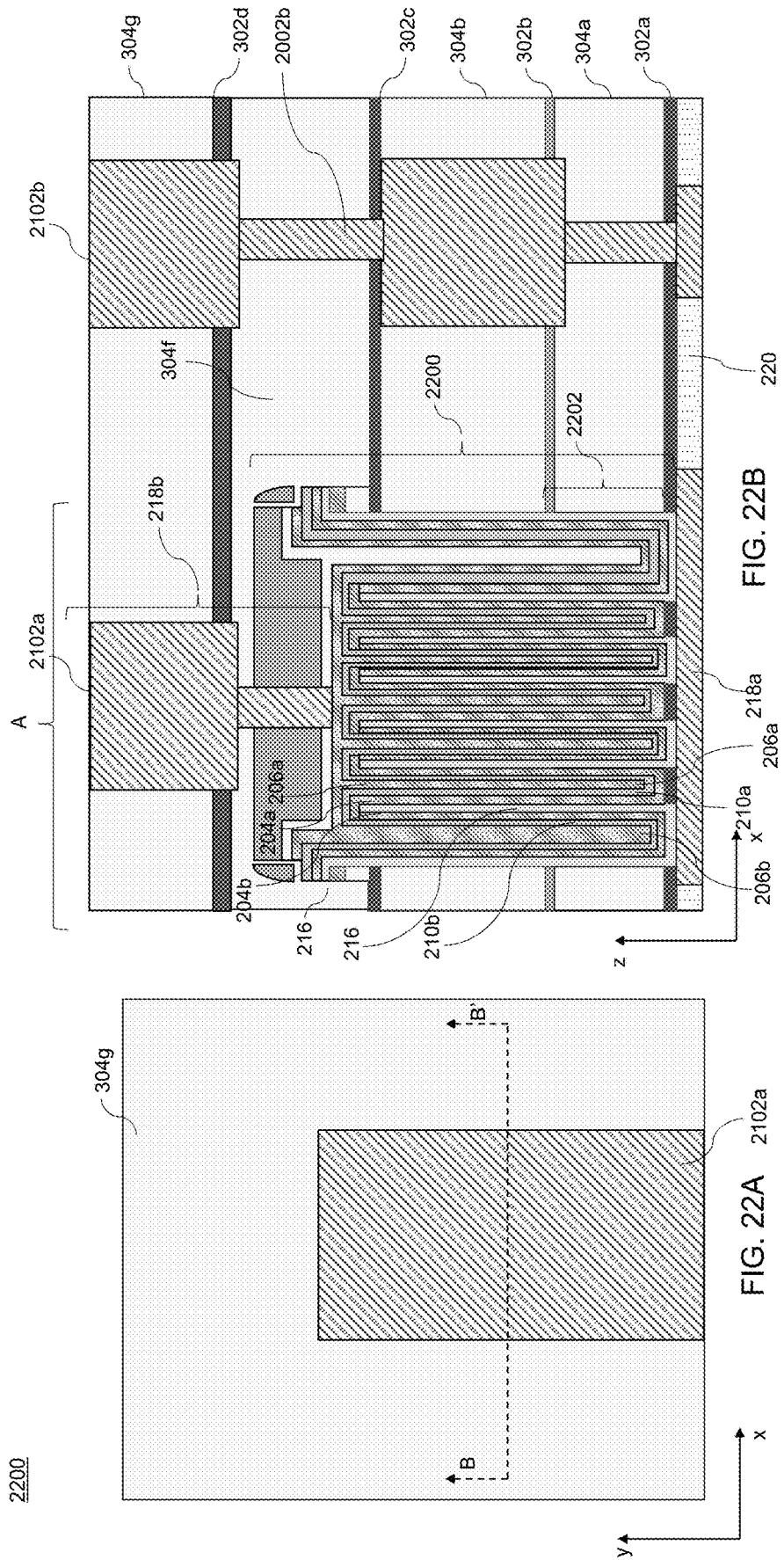
FIG. 22A is a top view of a further high-density capacitor that may be formed in a BEOL process, according to various embodiments.
FIG. 22B is a vertical cross-sectional view of the high-density capacitor of FIG. 22A, according to various embodiments.

FIG. 22A is a horizontal cross-sectional view of a further high-density capacitor 2200 that may be formed in a BEOL process, and FIG. 22B is a vertical cross-sectional view of the high-density capacitor 2200 of FIG. 22A, according to various embodiments. The plane defining the vertical cross-sectional view of FIG. 22B is indicated by the cross section B-B' in FIG. 22A and the region of the high-density capacitor 2200 shown in the top view of FIG. 22A is indicated by the brace labeled "A" in FIG. 22B. The high-density capacitor 2200 may be formed using operations similar to those used to form the high-density capacitor 200, as described above with reference to FIGS. 3A to 21B.

In contrast to the operations described above with reference to FIGS. 11B, in which the pillar structures 502 are etched down to the second boundary layer 302b, in forming the high-density capacitor 2200 of FIGS. 22A and 22B, the etching process may be allowed to further etch through the second boundary layer 302b and the first dielectric layer 304a. Thus, as shown in FIG. 22B, the inner shells 204a of the bottom electrode (204a, 204b), vertical portions 206a of the top electrode (206a, 206b), and the first concentric portion 210a of the dielectric layer 210 may extend down into a region 2202 that is lower than an extent of the corresponding structures in the high-density capacitor 200 of FIGS. 2A, 2B, 21A, and 21B. A capacitance of the high-density capacitor 2200 may be increased, relative to that of the high-density capacitor 200, by thus extending the length of the inner shells 204a of the bottom electrode (204a, 204b), vertical portions 206a of the top electrode (206a, 206b), and the first concentric portion 210a of the dielectric layer 210. As such, the high-density capacitor 2200 may have improved characteristics relative to the high-density capacitor 200.

Figures 23A, 23B:
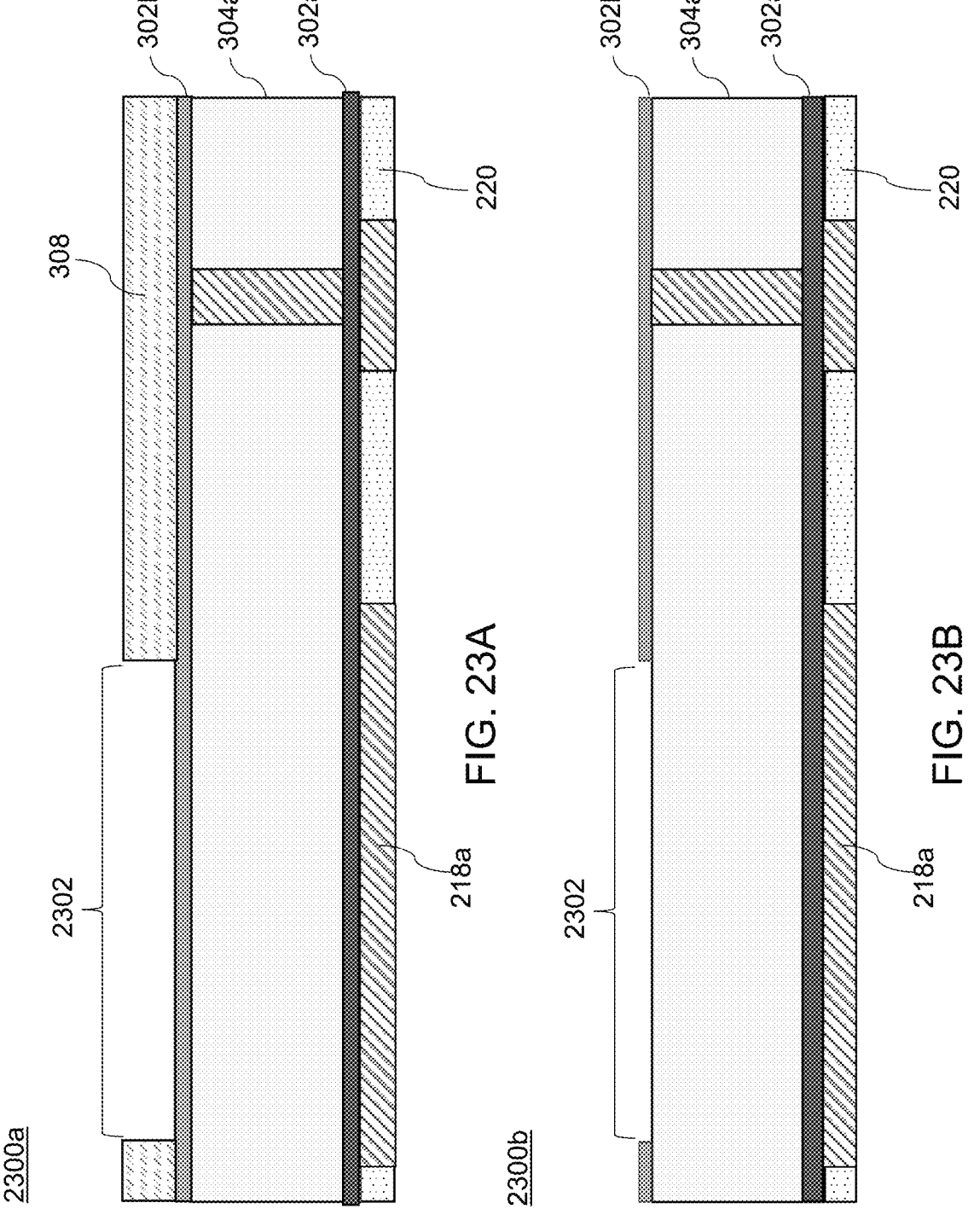
FIG. 23A is a vertical cross-sectional view of an intermediate structure that may be used in the formation of the high-density capacitor of FIGS. 22A and 22B, according to various embodiments.
FIG. 23B is a vertical cross-sectional view of a further intermediate structure that may be used in the formation of the high-density capacitor of FIGS. 22A and 22B, according to various embodiments.

FIG. 23A is a vertical cross-sectional view of an intermediate structure 2300a that may be used in the formation of the high-density capacitor 2200 of FIGS. 22A and 22B, and FIG. 23B is a vertical cross-sectional view of a further intermediate structure 2300b that may be used in the formation of the high-density capacitor 2200 of FIGS. 22A and 22B, according to various embodiments. The plane defining the vertical cross-sectional views of FIGS. 23A and 23B is indicated by the cross section B-B' in FIG. 22A. In this regard, the etching process described above with reference to FIGS. 11B, that may be used in forming the high-density capacitor 2200 of FIGS. 22A and 22B, may be improved by first etching a portion 2302 of the second boundary layer 302b. Thus, as shown in FIG. 23A, after formation of the first dielectric layer 304a and the second boundary layer 302b, a patterned photoresist 308 may be formed over the second boundary layer 302b. The patterned photoresist 308 may then be used as a mask during an etching process that may be performed to remove the portion 2302 of the second boundary layer, as shown in FIG. 23B. The patterned photoresist 308 may then be removed by ashing or by dissolution with a solvent. Additional operations may then be performed to generate the starting structure of FIGS. 3A and 3B that may be used to form either the high-density capacitor 200 of FIGS. 2A and 2B or the high-density capacitor 2200 of FIGS. 22A and 22B.

FIG. 24 is a flowchart illustrating operations of a method 2400 of forming a high-density capacitor (200, 2200). In operation 2402, the method 2400 may include etching an interlayer dielectric layer (304a, 304b, 304c) to generate a plurality of pillar structures 502. In operation 2404, the method 2400 may include depositing a first electrically conducting layer 702 over the plurality of pillar structures 502 and surrounding areas to generate a plurality of outer shells 204b of a bottom electrode (204a, 204b). In operation 2406, the method 2400 may include etching the plurality of pillar structures 502 to form a plurality of cylindrical cavities 1102 in the plurality of pillar structures 502. In operation 2408, the method 2400 may include depositing a second electrically conducting layer 704 within the plurality of cylindrical cavities 1102 to generate a plurality of inner shells 204a of the bottom electrode (204a, 204b). In operation 2410, the method 2400 may include depositing a dielectric layer 210 over the bottom electrode (204a, 204b), and in operation 2412, the method 2400 may include depositing a third electrically conducting layer 206 over the dielectric layer 210 to generate a plurality of vertical portions 206a and a surrounding portion 206b of a top electrode (206a, 206b).

In various embodiments, the method 2400 may further include forming a barrier layer 216 over the plurality of pillar structures 502 and surrounding areas prior to depositing the first electrically conducting layer 702 over the plurality of pillar structures 502 and surrounding areas. The method 2400 may further include electrically connecting the bottom electrode (204a, 204b) to a first interconnect structure 218a formed below the high-density capacitor (200, 2200) and electrically connecting the top electrode (206a, 206b) to a second interconnect structure 218b formed above the high-density capacitor (200, 2200). According to the method 2400, operation 2406 of etching the interlayer dielectric layer (304a, 304b, 304c) to generate the plurality of pillar structures 502 may further include generating the plurality of pillar structures 502 to have a separation distance 212 between adjacent pillar structures 502 that is less than or equal to 0.2 microns (e.g., see FIG. 2A).

Referring to all drawings and according to various embodiments of the present disclosure, a high-density capacitor (200, 2200) is provided. The high-density capacitor (200, 2200) may include a bottom electrode (204a, 204b) including a first cylindrical structure 202 including a first inner shell 204a and a first outer shell 204b that is concentric with the first inner shell 204a. The high-density capacitor (200, 2200) may further include a top electrode (206a, 206b) including a first vertical portion 206a and a surrounding portion 206b, such that the first vertical portion 206a is vertically surrounded by the first inner shell 204a of the bottom electrode (204a, 204b) and the surrounding portion 206b vertically surrounds the first outer shell 204b of the bottom electrode (204a, 204b). The high-density capacitor (200, 2200) may further include a dielectric layer 210 separating the top electrode (206a, 206b) from the bottom electrode (204a, 204b) and a barrier layer 216 separating the first inner shell 204a of the bottom electrode (204a, 204b) from the first outer shell 204b of the bottom electrode (204a, 204b).

In various embodiments, the bottom electrode (204a, 204b) may include a second cylindrical structure 202 that is non-concentric with the first cylindrical structure 202. The second cylindrical structure 202 may include a second inner shell 204a and a second outer shell 204b that is concentric with the second inner shell 204a. The top electrode (206a, 206b) further may include a second vertical portion 206a that is vertically surrounded by the second inner shell 204a of the bottom electrode (204a, 204b) and the surrounding portion 206b vertically surrounds the second outer shell 204b of the bottom electrode (204a, 204b). In various embodiments, the first vertical portion 206a of the top electrode (206a, 206b) and the second vertical portion 206a of the top electrode (206a, 206b) may be separated from one another by a separation distance 212 that is less than or equal to 0.2 microns.

In various embodiments, the dielectric layer 210 further may include a first concentric portion 210a that separates the first vertical portion 206a of the top electrode (206a, 206b) from the first inner shell 204a of the bottom electrode (204a, 204b) and a second concentric portion 210b that separates the first outer shell 204b of the bottom electrode (204a, 204b) from the surrounding portion 206b of the top electrode (206a, 206b). In various embodiments a diameter 214 of the second concentric portion 210b may be less than or equal to 0.2 microns. In still further embodiments (e.g., see FIGS. 2A and 2B) the bottom electrode (204a, 204b) further may include a plurality of non-concentric cylindrical portions 202, with each of the plurality of non-concentric cylindrical portions 202 including an inner shell 204a and an outer shell 204b. In such embodiments, the top electrode (206a, 206b) further may include a plurality of vertical portions 206a each vertically surrounded by the inner shell 204a of a respective cylindrical portion 202 and the surrounding portion 206b of the top electrode (206a, 206b) may respectively surround each of the plurality of non-concentric cylindrical portions 202 of the bottom electrode (204a, 204b) such that adjacent non-concentric cylindrical portions 202 of the bottom electrode (204a, 204b) are separated from one another by the surrounding portion 206b of the top electrode (206a, 206b).

In some embodiments, at least some of the plurality of non-concentric cylindrical portions 202 of the bottom electrode (204a, 204b) may include a spatial distribution having a hexagonal symmetry (e.g., see FIGS. 2A and 2B). In such embodiments, the bottom electrode (204a, 204b) may be electrically connected to a first interconnect structure 218a formed below the high-density capacitor (200, 2200) and the top electrode (206a, 206b) is electrically connected to a second interconnect structure 218b formed above the high-density capacitor (200, 2200). In various embodiments, the dielectric layer 210 further may include a high-k dielectric material including one or more of hafnium oxide, hafnium silicon oxide, hafnium tantalum oxide, hafnium titanium oxide, hafnium zirconium oxide, zirconium oxide, titanium oxide, aluminum oxide, and hafnium dioxide-alumina. In various embodiments, the high-density capacitor (200, 2200) may be disposed over an interlayer dielectric layer 220 that includes an interconnect structure 218a.

In some embodiments, the first inner shell 204a and the first outer shell 204b may each include a conductive material having a thickness that is less than or equal to 10 nm and the barrier layer 216 may include one or more of Ta and TaN. The bottom electrode (204a, 204b) and the top electrode (206a, 206b) each include one or more of TiN, TaN, WN, TiC, TaC, or WC, in various embodiments.

In a further embodiment, a high-density capacitor (200, 2200) is provided. The high-density capacitor (200, 2200) may include a bottom electrode (204a, 204b) having a plurality of non-concentric cylindrical portions 202, with each of the plurality of non-concentric cylindrical portions 202 including an inner shell 204a and an outer shell 204b and a top electrode (206a, 206b) including a plurality of vertical portions 206a and a surrounding portion 206b. In such an embodiment, each of the plurality of vertical portions 206a may be vertically surrounded by the inner shell 204a of a respective cylindrical portion 202 of the bottom electrode (204a, 204b) and the surrounding portion 206b of the top electrode (206a, 206b) may respectively surround each of the plurality of non-concentric cylindrical portions 202 of the bottom electrode (204a, 204b) such that adjacent non-concentric cylindrical portions 202 of the bottom electrode (204a, 204b) are separated from one another by the surrounding portion 206b of the top electrode (206a, 206b).

The high-density capacitor (200, 2200) may further include a dielectric layer 210 separating the top electrode (206a, 206b) from the bottom electrode (204a, 204b). In various embodiments, at least some of the plurality of non-concentric cylindrical portions 202 of the bottom electrode (204a, 204b) include a spatial distribution having a hexagonal symmetry (e.g., see FIGS. 2A and 2B). In various embodiments, adjacent ones of the plurality of vertical portions 206a may be separated from one another by a separation distance 212 that is less than or equal to 0.2 microns. The dielectric layer 210 may further include a first concentric portion 210a that separates each of the plurality of vertical portions 206a of the top electrode (206a, 206b) from the inner shell 204a of the bottom electrode (204a, 204b), and a second concentric portion 210b that separates the outer shell 204b of the bottom electrode (204a, 204b) from the surrounding portion 206b of the top electrode (206a, 206b). In some embodiments, a diameter 214 of the second concentric portion 210b may be less than or equal to 0.2 microns.

The dielectric layer 210 may include a high-k dielectric material including one or more of hafnium oxide, hafnium silicon oxide, hafnium tantalum oxide, hafnium titanium oxide, hafnium zirconium oxide, zirconium oxide, titanium oxide, aluminum oxide, and hafnium dioxide-alumina. Further, in various embodiments, the bottom electrode (204a, 204b) may be electrically connected to a first interconnect structure 218a formed below the high-density capacitor (200, 2200) and the top electrode (206a, 206b) may be electrically connected to a second interconnect structure 218b formed above the high-density capacitor (200, 2200).

Various embodiments of this disclosure provide a high-density capacitor (200, 2200) and methods of forming the same that may be advantageous in terms of manufacturing flexibility, reduced size, and increased capacitance. In this regard, the high-density capacitor (200, 2200) may be formed in a BEOL process and may be incorporated with other BEOL circuit components such as TFT devices. As such, the embodiment high-density capacitor (200, 2200) may include materials that may be processed at low temperatures and thus, may not damage previously fabricated devices (e.g., FEOL and MEOL devices). An embodiment high-density capacitor (200, 2200) includes a bottom electrode (204a, 204b) having a plurality of non-concentric cylindrical portions 202 each having a diameter 214 that is less than or equal to 0.2 microns and a top electrode (206a, 206b) having vertical portions 206a that are vertically surrounded by the cylindrical portions of the bottom electrode (204a, 204b). Further, the vertical portions 206a may be separated from one another by a separation distance that is also less than or equal to 0.2 microns. In some embodiments, the plurality of non-concentric cylindrical portions 202 may have a spatial distribution that has a hexagonal symmetry (e.g., see FIG. 2A) that allows for close packing of the non-concentric cylindrical portions 202. As such, the bottom electrode (204a, 204b) and top electrode (206a, 206b) may form a densely packed capacitor structure (200, 2200) that is compatible with other circuit elements formed in BEOL processing operations.

The foregoing outlines features of several embodiments so that those skilled in the art may better understand the aspects of this disclosure. Those skilled in the art should appreciate that they may readily use this disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of this disclosure.

What is claimed is:

1. A method of forming a high-density capacitor, comprising:
   etching an interlayer dielectric layer to generate a plurality of pillar structures;
   depositing a first conductive material over the plurality of pillar structures and surrounding areas to generate a plurality of outer shells of a bottom electrode;
   etching the plurality of pillar structures to form a plurality of cavities in the plurality of pillar structures;
   depositing a second conductive material within the plurality of cavities to generate a plurality of inner shells of the bottom electrode;
   depositing a dielectric layer over the bottom electrode; and
   depositing a third conductive material over the dielectric layer to generate a plurality of vertical portions and a surrounding portion of a top electrode.

2. The method of claim 1, further comprising forming a barrier layer over the plurality of pillar structures and the surrounding areas prior to depositing the first conductive material over the plurality of pillar structures and the surrounding areas.

3. The method of claim 1, further comprising:
   electrically connecting the bottom electrode to a first interconnect structure formed below the high-density capacitor; and
   electrically connecting the top electrode to a second interconnect structure formed above the high-density capacitor.

4. The method of claim 1, wherein etching the interlayer dielectric layer to generate the plurality of pillar structures further comprises generating the plurality of pillar structures to have a separation distance between adjacent pillar structures that is less than or equal to 0.2 microns.

5. The method of claim 4, wherein the barrier layer has a thickness in a range from 2 nm to 20 nm and is deposited by one of chemical vapor deposition, atomic layer deposition, or physical vapor deposition.

6. A method of forming a high-density capacitor, comprising:
   patterning a hard mask layer to form a patterned hard mask having a plurality of circular masked regions with at least some of the circular masked regions having a spatial distribution with hexagonal symmetry;
   etching through a plurality of dielectric layers and boundary layers using the patterned hard mask to generate a plurality of pillar structures;
   forming a barrier layer over the plurality of pillar structures and surrounding areas;
   depositing a first conductive material over the barrier layer to generate a plurality of outer shells of a bottom electrode;
   selectively etching the plurality of pillar structures to form a plurality of cylindrical cavities extending into the plurality of pillar structures;
   depositing a second conductive material within the plurality of cylindrical cavities to generate a plurality of inner shells of the bottom electrode;
   depositing a dielectric layer over the bottom electrode; and
   depositing a third conductive material over the dielectric layer to generate a plurality of vertical portions and a surrounding portion of a top electrode.

7. The method of claim 6, further comprising forming an electrically conducting via in contact with the third conductive material, wherein the electrically conducting via coupled with an electrically conducting line forms a second interconnect structure that electrically connects the top electrode to external circuitry.

8. The method of claim 7, wherein the barrier layer includes an electrically conductive material forming an electrically conductive connection with the bottom electrode.

9. The method of claim 8, wherein the barrier layer is in contact with a first interconnect structure, the plurality of inner shells of the bottom electrode, and the plurality of outer shells of the bottom electrode, wherein the first interconnect structure connects the bottom electrode to the external circuitry.

10. The method of claim 6, wherein selectively etching the plurality of pillar structures comprises removing the first conductive material and the barrier layer from a top portion of the plurality of pillar structures.

11. The method of claim 10, wherein selectively etching the plurality of pillar structures further comprises exposing the patterned hard mask from the top portion of the plurality of pillar structures.

12. The method of claim 11, wherein selectively etching the plurality of pillar structures further comprises removing the patterned hard mask and etching through the plurality of dielectric layers and boundary layers of the plurality of pillar structures.

13. A method of forming a semiconductor structure, comprising:

provising a substrate having a first metal interconnect structure;

depositing a plurality of dielectric layers and boundary layers over the first metal interconnect structure;

patterning a hard mask layer to form a patterned hard mask having a plurality of circular masked regions with at least some of the circular masked regions having a spatial distribution with hexagonal symmetry;

etching through the plurality of dielectric layers and boundary layers using the patterned hard mask to generate a plurality of pillar structures, wherein the etching is configured to expose a part of the first metal interconnect structure;

depositing a barrier layer over the plurality of pillar structures and the exposed part of the first metal interconnect structure;

depositing a first conductive material over the barrier layer;

depositing a first protective layer over the first conductive material and around the plurality of pillar structures;

recessing the first protective layer to expose the first conductive material from a top portion of the plurality of pillar structures;

removing the first conductive material and the barrier layer from the top portion of the plurality of pillar structures;

removing the patented hard mask; and selectively etching through the plurality of dielectric layers and boundary layers of the plurality of pillar structures to create a plurality of cylindrical cavities.

14. The method of claim 13, further including patterning after recessing the first protective layer, wherein the patterning exposes the first conductive material from the top portion of the plurality of pillar structures.

15. The method of claim 13, wherein removing the first conductive material and the barrier layer exposes the patterned hard mask from the top portion of the plurality of pillar structures.

16. The method of claim 13, further comprising depositing a second conductive material within the plurality of cylindrical cavities.

17. The method of claim 16, further comprising depositing a dielectric layer over the second conductive material within the plurality of cylindrical cavities.

18. The method of claim 17, further comprising depositing a third conductive material over the dielectric layer within the plurality of cylindrical cavities.

19. The method of claim 18, wherein:

the barrier layer is in direct contact with the first metal interconnect structure, the first conductive material, and the second conductive material; and the first metal interconnect structure connects the first conductive material and the second conductive material to external circuitry.

20. The method of claim 19, wherein:

the barrier layer includes an electrically conductive material forming an electrically conductive connection with the first metal interconnect structure, the first conductive material, and the second conductive material; and the barrier layer has a thickness in a range from 2 nm to 20 nm and is deposited by one of chemical vapor deposition, atomic layer deposition, or physical vapor deposition.

* * * * *